(12) United States Patent
Wu et al.

(10) Patent No.: US 10,522,469 B2
(45) Date of Patent: Dec. 31, 2019

(54) SPLIT RAIL STRUCTURES LOCATED IN ADJACENT METAL LAYERS

(71) Applicant: Taiwan Semiconductor Manufacturing Co., Ltd., Hsin-Chu (TW)

(72) Inventors: Chia-Tien Wu, Taichung (TW); Hsiang-Wei Liu, Tainan (TW); Wei-Chen Chu, Taichung (TW)

(73) Assignee: TAIWAN SEMICONDUCTOR MANUFACTURING CO., LTD. (TW)

( * ) Notice: Subject to any disclaimer, the term of this patent is extended or adjusted under 35 U.S.C. 154(b) by 0 days.

(21) Appl. No.: 16/384,673

(22) Filed: Apr. 15, 2019

(65) Prior Publication Data

US 2019/0244902 A1   Aug. 8, 2019

Related U.S. Application Data

(60) Continuation of application No. 16/022,131, filed on Jun. 28, 2018, now Pat. No. 10,269,715, which is a division of application No. 15/294,286, filed on Oct. 14, 2016, now Pat. No. 10,020,261.

(51) Int. Cl.
| | |
|---|---|
| *H01L 23/48* | (2006.01) |
| *H01L 23/535* | (2006.01) |
| *H01L 23/528* | (2006.01) |
| *H01L 21/768* | (2006.01) |
| *H01L 23/522* | (2006.01) |
| *H01L 21/033* | (2006.01) |

(52) U.S. Cl.
CPC .......... *H01L 23/535* (2013.01); *H01L 21/033* (2013.01); *H01L 21/76816* (2013.01); *H01L 21/76832* (2013.01); *H01L 21/76877* (2013.01); *H01L 21/76895* (2013.01); *H01L 23/528* (2013.01); *H01L 23/5226* (2013.01); *H01L 23/5286* (2013.01)

(58) Field of Classification Search
None
See application file for complete search history.

(56) References Cited

U.S. PATENT DOCUMENTS

| | | | |
|---|---|---|---|
| 6,445,065 B1 * | 9/2002 | Gheewala | ........... H01L 23/5286 257/208 |
| 6,483,176 B2 | 11/2002 | Noguchi et al. | |
| 8,039,179 B2 | 10/2011 | Shieh et al. | |

(Continued)

*Primary Examiner* — Hung K Vu
(74) *Attorney, Agent, or Firm* — Haynes and Boone, LLP

(57) ABSTRACT

A first metal layer of a semiconductor device includes a plurality of first metal lines that each extend along a first axis, and a first rail structure that extends along the first axis. The first rail structure is physically separated from the first metal lines. A second metal layer is located over the first metal layer. The second metal layer includes a plurality of second metal lines that each extend along a second axis orthogonal to the first axis, and a second rail structure that extends along the first axis. The second rail structure is physically separated from the second metal lines. The second rail structure is located directly over the first rail structure. A plurality of vias is located between the first metal layer and the second metal layer. A subset of the vias electrically interconnects the first rail structure to the second rail structure.

20 Claims, 16 Drawing Sheets

(56) References Cited

U.S. PATENT DOCUMENTS

| | | |
|---|---|---|
| 8,202,681 B2 | 6/2012 | Lin et al. |
| 8,728,332 B2 | 5/2014 | Lin et al. |
| 8,822,243 B2 | 9/2014 | Yan et al. |
| 9,437,580 B1 | 9/2016 | No et al. |
| 9,437,588 B1 * | 9/2016 | Zeng .................. H01L 27/0207 |
| 2006/0091468 A1 | 5/2006 | Liaw |
| 2011/0281208 A1 | 11/2011 | Lin et al. |
| 2012/0278776 A1 | 11/2012 | Lei et al. |
| 2013/0295769 A1 | 11/2013 | Lin et al. |
| 2013/0320451 A1 | 12/2013 | Liu et al. |
| 2014/0193974 A1 | 7/2014 | Lee et al. |
| 2014/0215421 A1 | 7/2014 | Chen et al. |
| 2014/0217514 A1 | 8/2014 | Moroz et al. |
| 2014/0242794 A1 | 8/2014 | Lin et al. |
| 2014/0264760 A1 | 9/2014 | Chang et al. |
| 2014/0264899 A1 | 9/2014 | Chang et al. |
| 2014/0273442 A1 | 9/2014 | Liu et al. |
| 2014/0273446 A1 | 9/2014 | Huang et al. |
| 2017/0133365 A1 * | 5/2017 | Lim .................... H01L 23/5226 |

* cited by examiner

SPLIT RAIL STRUCTURES LOCATED IN ADJACENT METAL LAYERS

PRIORITY DATA

This application is a continuation of U.S. application Ser. No. 16/022,131, filed Jun. 28, 2018, which is a divisional of U.S. application Ser. No. 15/294,286, filed Oct. 14, 2016, issued on Jul. 10, 2018 as U.S. Pat. No. 10,020,261, the entire disclosure of which is hereby incorporated by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

As a part of the semiconductor fabrication, a multi-layered interconnect structure that includes a plurality of conductive elements such as metal lines and vias may be formed to provide electrical interconnections for the various components for an IC. Rail structures such as power rails (e.g., voltage rails or ground rails) may be formed in one or more of the interconnect layers of the interconnect structure. However, due to electromigration concerns, the rail structures may need to be formed to be sufficiently wide. The minimum width of the rail structures needed may unnecessarily enlarge the size of circuit cells that contain the rail structures, for example a CMOS cell. Consequently, the IC chip may not achieve a compact size or a desired circuit density.

Therefore, while existing rail structures (and the fabrication thereof) on ICs have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A-12A are diagrammatic planar views of a semiconductor device at different stages of fabrication according to various embodiments of the present disclosure.

FIGS. 1B-12B are diagrammatic cross-sectional side views of the semiconductor device at different stages of fabrication according to various embodiments of the present disclosure.

DETAILED DESCRIPTION

Figure 1A:
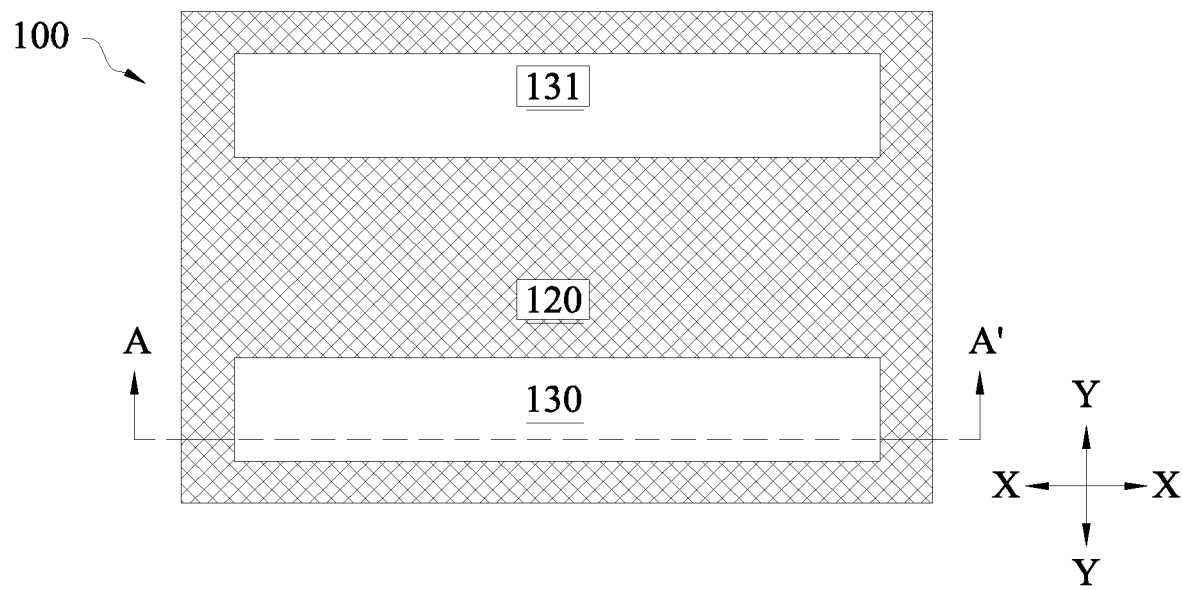

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Modern ICs may include circuit cells such as Complementary Metal-Oxide-Semiconductor (CMOS) cells. The CMOS cells include rail structures, for example power rails (e.g., voltage rails such as Vdd or Vss) and ground rails. The rail structures may be formed as metal lines in one or more of the metal layers of an interconnect structure. Due to electromigration considerations—where electromigration may refer to the transport of material caused by the gradual movement of the ions in a conductor due to the momentum transfer between conducting electrons and diffusing metal atoms—the metal lines being used as the rail structures may need to achieve a certain size such as a minimum width, since larger rail structures (e.g., having wider width) may better handle the electromigration. Unfortunately, increasing the width of the rail structures may also enlarge the size of the CMOS cell, which is undesirable.

To overcome the problems discussed above, the present disclosure splits the rail structures between multiple adjacent metal layers, thereby decreasing the width for the rail structure in any given metal layer. The rail structures that are split up are electrically interconnected together using vias, and thus the interconnected rail structures can still collectively function as intended. The details of how the rail structures are split up and the resulting device are discussed below with reference to FIGS. 1-15.

FIGS. 1A-12A are simplified diagrammatic planar views of a semiconductor device 100 at various stages of fabrication according to embodiments of the present disclosure, and FIGS. 1B-12B are simplified diagrammatic cross-sectional side views of the semiconductor device 100 at various stages of fabrication according to embodiments of the present disclosure. For example, each of the FIGS. 1B-12B is obtained by "cutting" the corresponding planar view FIGS. 1A-12A along a cutline A-A'. It is understood that the cutline A-A' may shift from Figure to Figure, so as to represent the cross-sectional view of different parts of the semiconductor device 100 at different stages of fabrication.

Figure 1B:
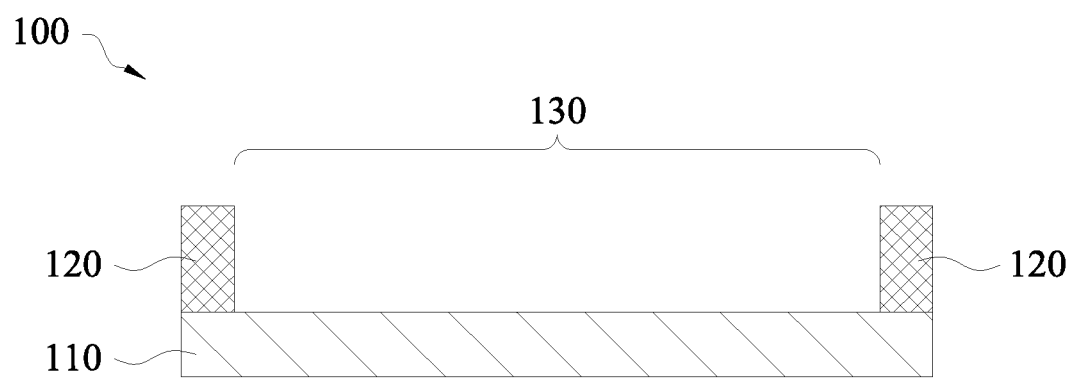

Referring to FIGS. 1A-1B, the semiconductor device 100 includes a hard mask layer 110. In various embodiments, the hard mask layer 110 may contain a material such as SiN, $SiO_x$, TiN, C, TiO, Si, $SiC_xO_yN_z$ (where x, y, z each range from 0 to n), or combinations thereof. It is understood that the semiconductor device 100 includes other layers and microelectronic components below the hard mask layer 110, for example doped regions such as source/drain formed in a semiconductor substrate, dielectric isolation structures (e.g., STI) formed in the substrate, gate structures formed over the substrate, or other interconnect layers (e.g., M1 metal layer). These microelectronic components may be a part of a traditional planar transistor (2D) or a 3-dimensional FinFET transistor. For reasons of simplicity, these layers and microelectronic components are not specifically illustrated herein.

Still referring to FIGS. 1A-1B, another hard mask layer 120 is formed over the hard mask layer 110. The hard mask layer 120 and the hard mask layer 110 may have different material compositions. In various embodiments, the hard mask layer 110 may contain a material such as $SiO_x$, TiN, Si, TiO, WC, $SiC_xO_yN_z$ (where x, y, z each range from 0 to n), or combinations thereof. The hard mask layer 120 may serve as an etch-stop layer for mandrels/spacers in a later process, which will be discussed in greater detail below.

The hard mask layer 120 is patterned to form openings 130-131. The openings 130-131 help define rail structures to be formed in a later process. For example, the opening 130 helps define a voltage rail such as Vdd, and the opening 131 helps define an electrical ground rail, or vice versa. As is shown in the planar view of FIG. 2A, the openings 130-131 are elongated and each extend in an X-direction (or X-axis).

Figure 2A:
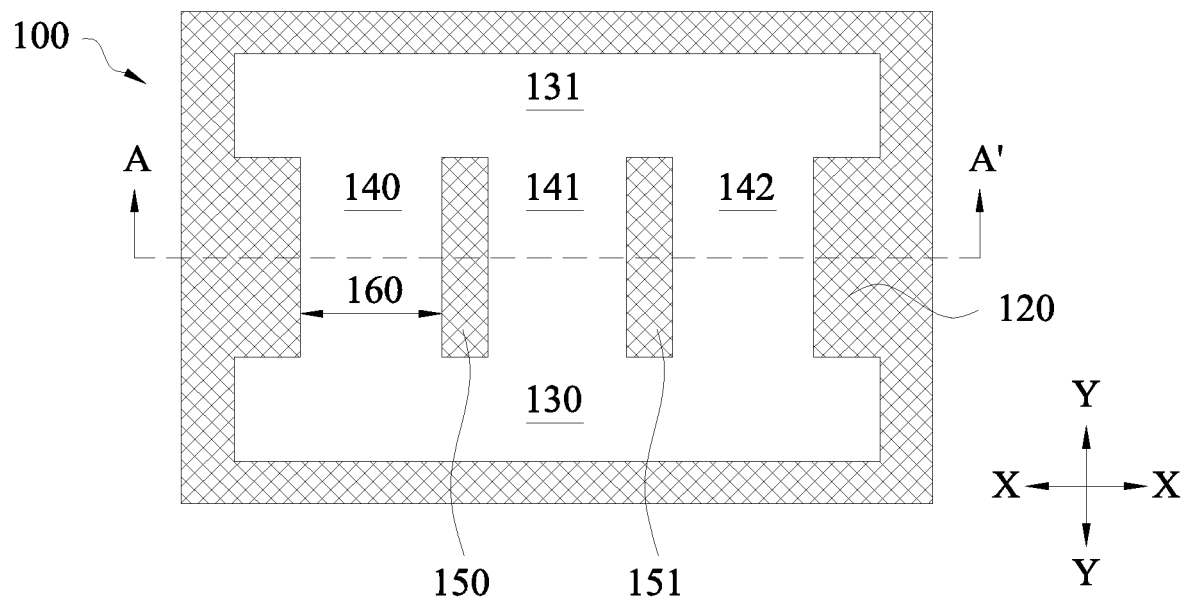
Figure 2B:
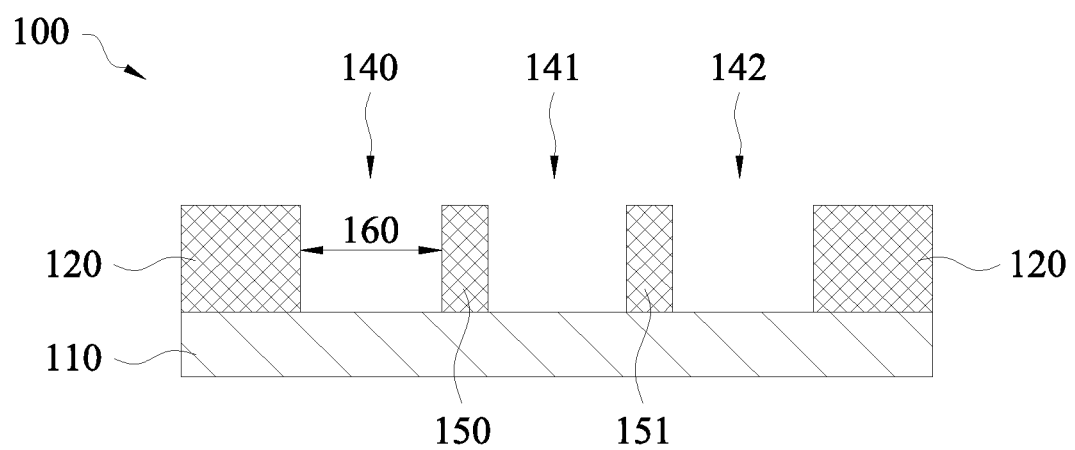

Referring now to FIGS. 2A-2B, one or more lithography and etching processes may be performed to the semiconductor device 100 to form openings 140, 141, and 142 in the hard mask layer 120. The openings 140-142 each extend in the Y-direction and have substantially equal dimensions 160 measured in the X-direction. In some embodiments, the dimension 160 is in a range from about 20 nm to about 80 nm.

The openings 140-142 help define (indirectly) a first set of metal lines in a metal layer (to be formed later). For ease of reference, the first set of metal lines are referred to as line A (or LA hereinafter). As is shown in the planar view of FIG. 2A, the openings 140-142 are formed to be connected to the openings 130-131. Meanwhile, "islands" 150 and 151— portions of the un-etched hard mask layer 120—still remain: the island 150 separates the openings 140 and 141, and the island 151 separates the openings 141 and 142. The location of the islands 150-151 correspond to another set of metal lines different from the metal lines LA. These metal lines (whose locations correspond to the islands 150-151) are referred to as line B, or "metal lines LB" hereinafter.

Figure 3A:
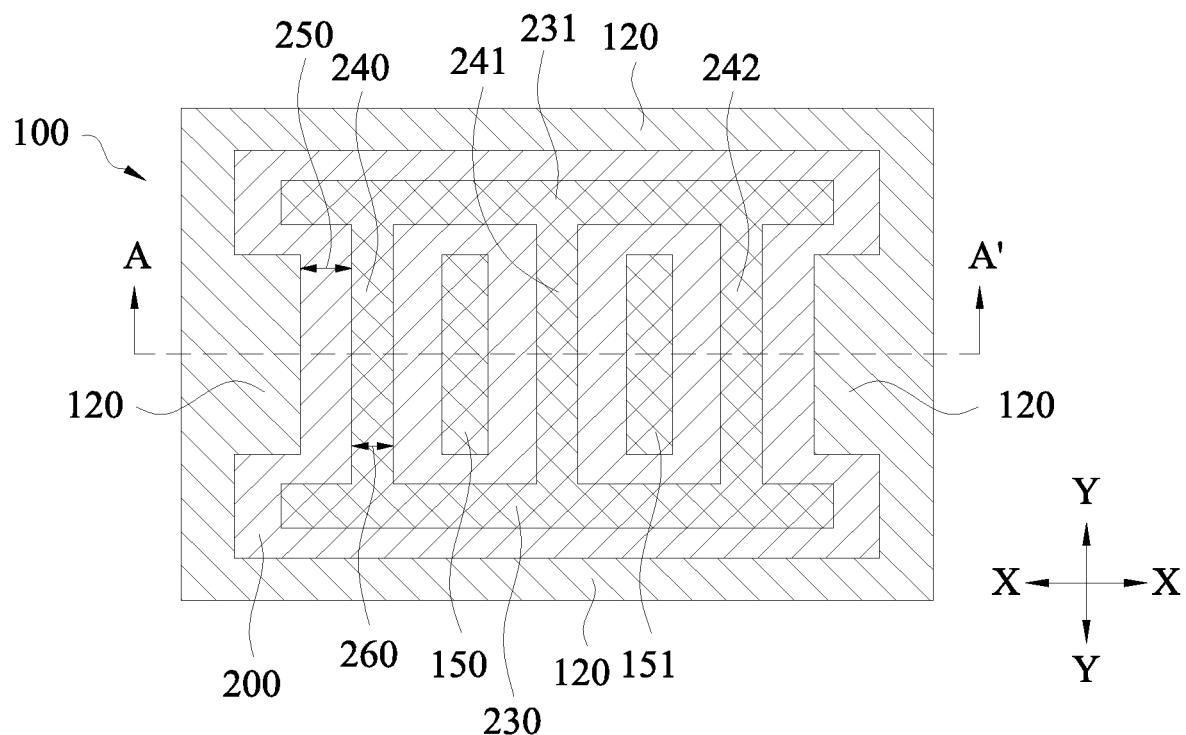
Figure 3B:
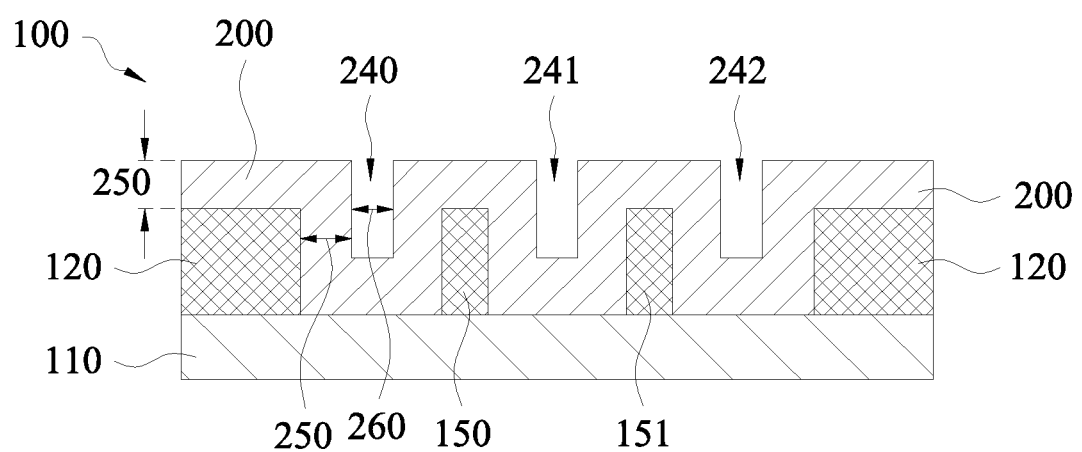

Referring now to FIGS. 3A-3B, a spacer layer 200 is formed over the semiconductor device 100. In some embodiments, the spacer layer 200 contains TiO, $SiO_x$, TiN, SiN, $SiC_xO_yN_z$ (where x, y, z each range from 0 to n), or combinations thereof. The spacer layer 200 covers the un-etched portion of the hard mask layer 120, and thus the hard mask layer 120 is not directly visible in the planar view of FIG. 3A. However, in order to better understand the processes of the present disclosure, the un-etched portions of the hard mask layer 120 (including the islands 150-151) are still illustrated (though with a different hatching) and labeled in the planar view of FIG. 3A.

The spacer layer 200 also partially fills the openings 130-131 and 140-142. The presence of the spacer layer 200 in the openings 130-131 and 140-142 effectively reduces the openings 130-131 into smaller openings 230-231, and reduces the openings 140, 141, 142 into smaller openings 240, 241, and 242, respectively. For example, the spacer layer 200 is formed to have a thickness 250. In some embodiments, the thickness 250 is in a range from about 10 nm to about 40 nm.

Due to the thickness 250 of the spacer layer 200, the size-reduced openings 240, 241, and 242 each have a dimension 260 measured in the X-direction. The dimension 260 is a function of the original dimension 160 (illustrated in FIG. 2A) of the openings 140-142 and the thickness 250 of the spacer layer 200. Specifically, the dimension 260=the dimension 160−2*(the thickness 250). The size-reduced openings 240-242 will define the metal lines LA. In other words, the dimension 260 of the openings 240-242 will correspond to the dimension (also referred to as a critical dimension) of the metal lines LA measured in the X-direction.

Figure 4A:
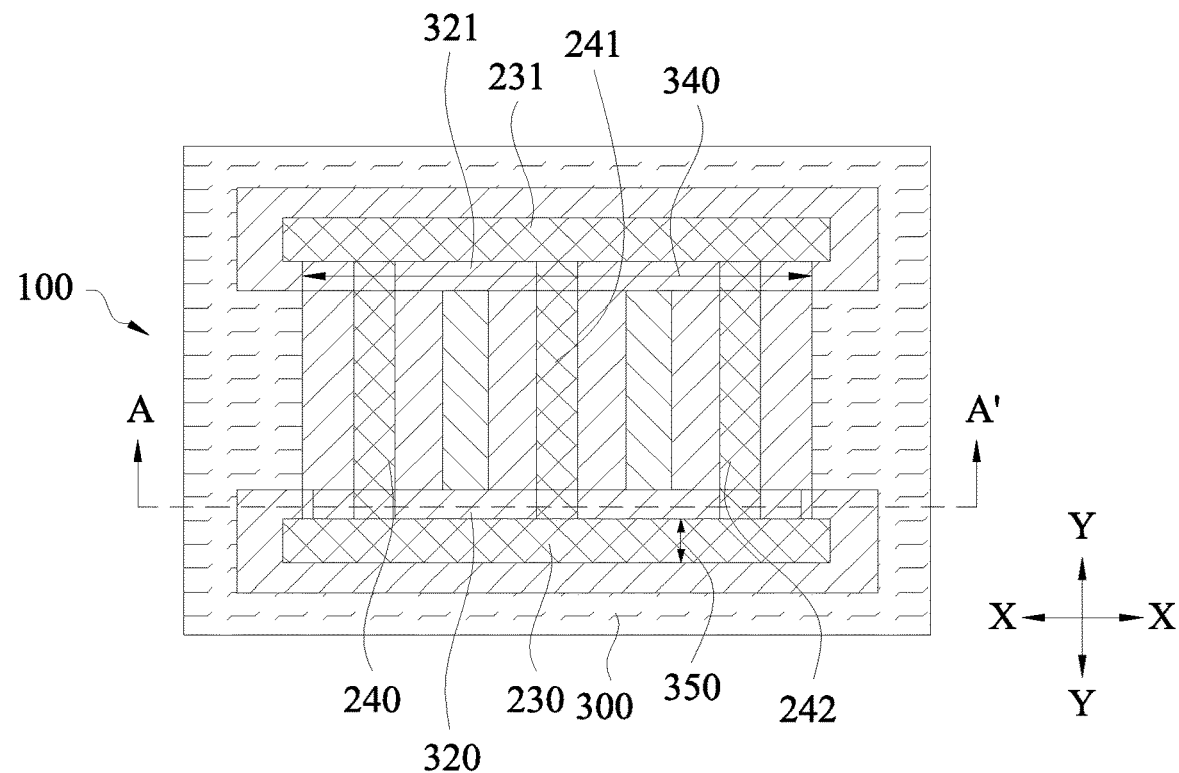
Figure 4B:
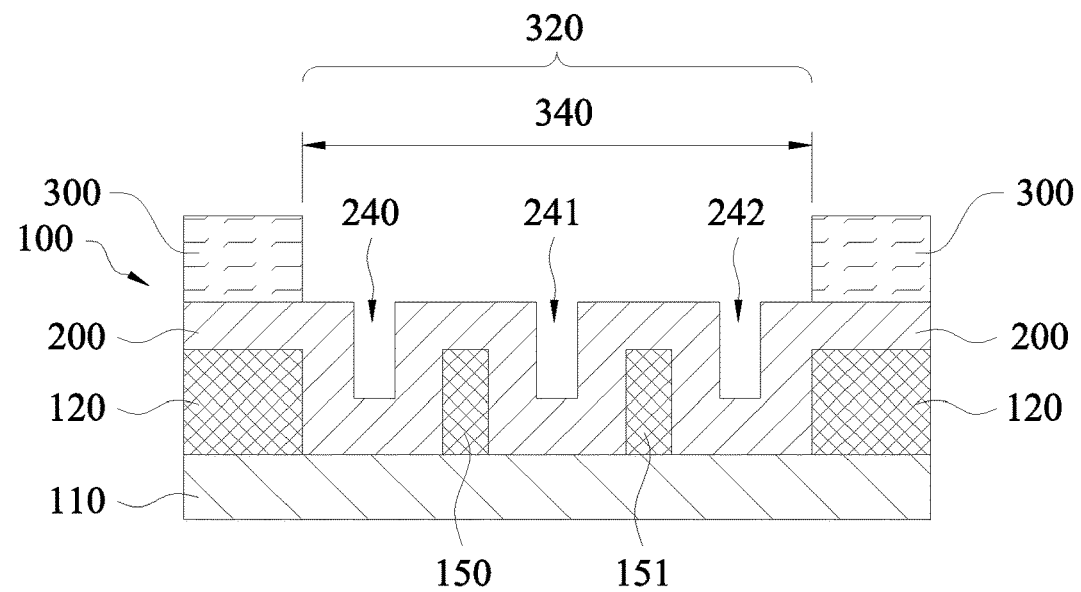

Referring now to FIGS. 4A-4B, a patterned photoresist layer 300 is formed over the semiconductor device 100, for example over the spacer layer 200. The patterned photoresist layer 300 is formed to define openings 320 and 321. In other words, the photoresist layer 300 covers the spacer layer 200, though certain portions of the spacer layer 200 are exposed by the openings 320-321. Though the openings 230-231 and 240-242 are not directly visible in the planar view of FIG. 4A (since they are covered by the photoresist layer 300), their respective locations are still labeled in FIG. 4A to provide more clarity.

The locations of the openings 320-321 are selected to "cut" or "sever" the openings 230-231 from the openings 240-242. For example, the opening 320 is formed so that it is located adjacently "above" the opening 230 (in the Y-direction in the planar view of FIG. 4A), and the opening 321 is formed so that it is located adjacently "below" the opening 231 (in the Y-direction in the planar view of FIG. 4A). These locations of the openings 320-321 cause the metal lines (formed later based on the openings 240-242) to be physically separated from the rail structures (formed later based on the openings 230-231). As such, this process may be referred to as a metal line LA cut. To ensure that all the metal lines can be physically separated from the rail structures, a dimension 340 (measured in the X-direction in the planar view of FIG. 4A) of the openings 320-321 is configured to be sufficiently great to span across all of the openings 240-242. In addition, the openings 320-321 each have a dimension 350 measured in the Y-direction in the planar view of FIG. 4A. The dimension 350 is configured to be big enough to reduce the risk of the metal lines not being able to be cleanly "cut" from the rail structure, yet small enough so as to not waste space. In some embodiments, the dimension 350 is in a range from about 10 nm to about 40 nanometers.

Figure 5A:
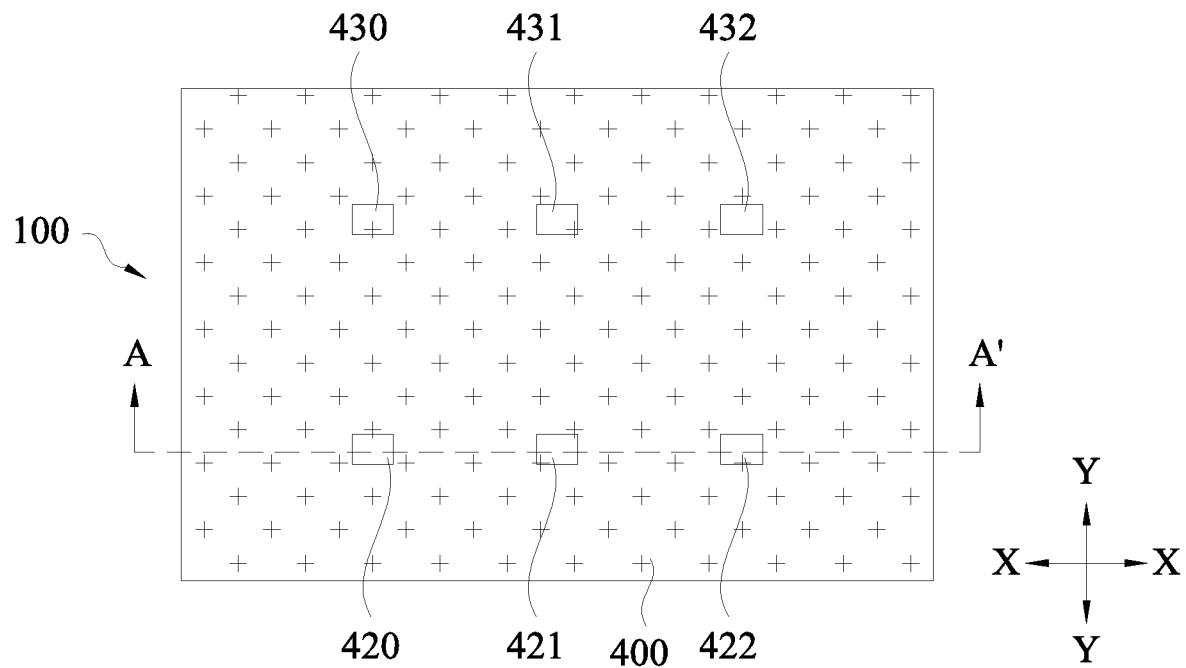
Figure 5B:
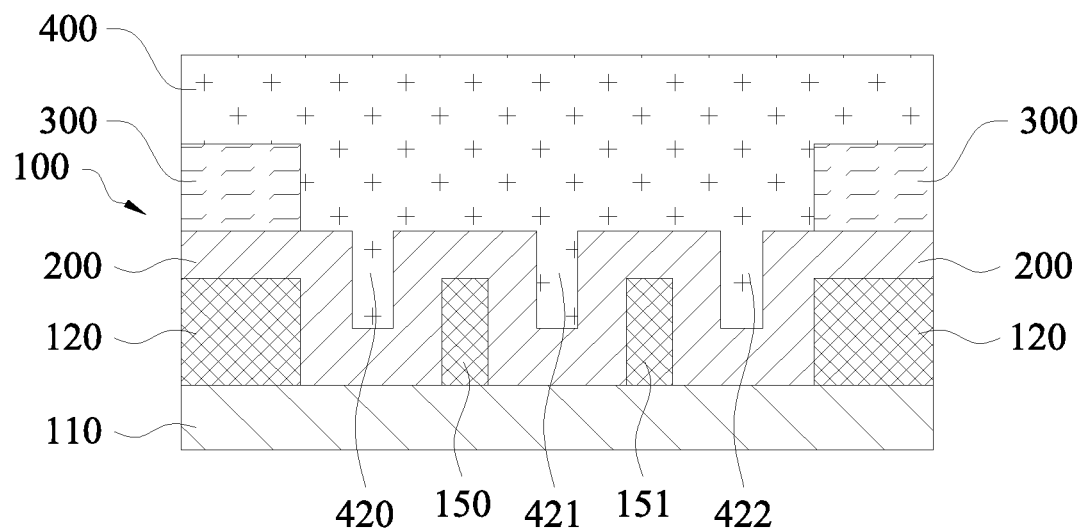

Referring now to FIGS. 5A-5B, a material layer 400 is formed over the semiconductor device 100. The formation of the material layer 400 may also be referred to as a "reversed material coating" process. The material layer 400 is formed over the patterned photoresist layer 300 and fills the openings 320 and 321. In some embodiments, the material layer 400 contains a dielectric material such as an oxide material, and the formation of the material layer 400 may involve a spin-on glass process. Segments 420, 421, and 422 of the material layer 400 now fill the openings 240-242 below the opening 320, and segments 430, 431, and 432 of the material layer 400 now fill the openings 240-242 below the opening 321 (the openings 240-242 and 320-321 are illustrated in FIG. 4A). The material layer 400 serves as another hard mask, and it (specifically, the segments 420-422 and 430-432 serving as a patterning mask later) will lead to physical separation between the metal lines from the rails structures. This will become more apparent based on the discussions below.

Figure 6A:
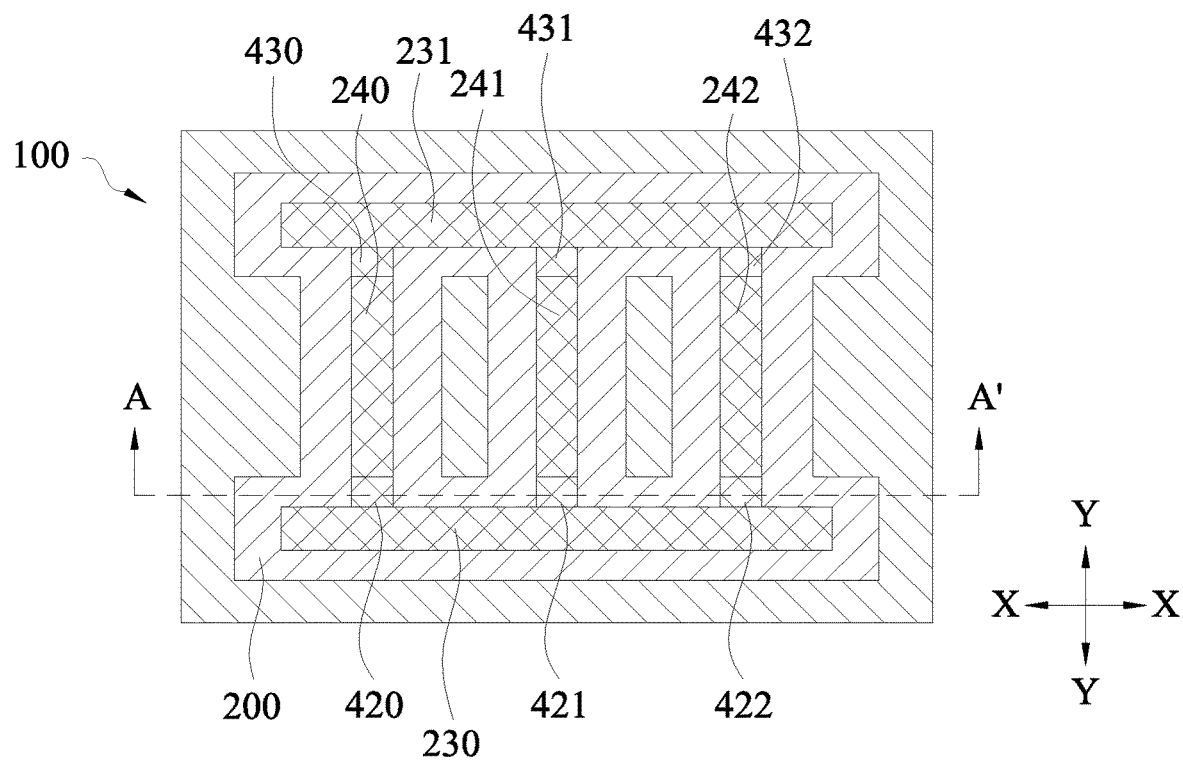
Figure 6B:
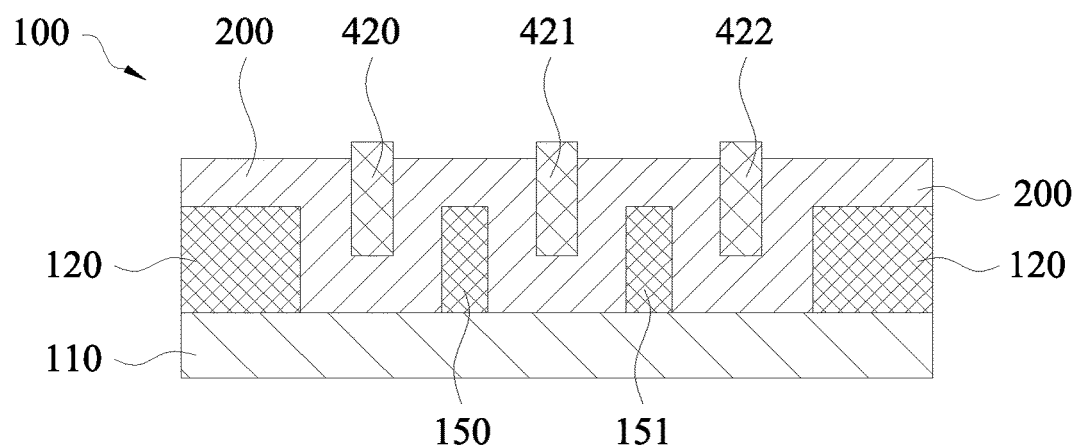

Referring now to FIGS. 6A-6B, an etching back process is performed to etch away the material layer 400 as well as the photoresist layer 300. As a result of the etching back process, most of the material layer 400 is removed, other than the segments 420-422 and 430-432. As is shown in the planar view of FIG. 6A, the segments 420-422 physically separate the opening 230 from the openings 240-242, and the segments 430-432 physically separate the opening 231 from the openings 240-242. Since the openings 230-231 are where the rail structures will be formed, and the openings 240-242 are where the metal lines will be formed, the segments 420-422 and 430-432 can be used as a mask in a later process, which will lead to physical separations between the rail structures and the metal lines formed in the same metal layer.

Figure 7A:
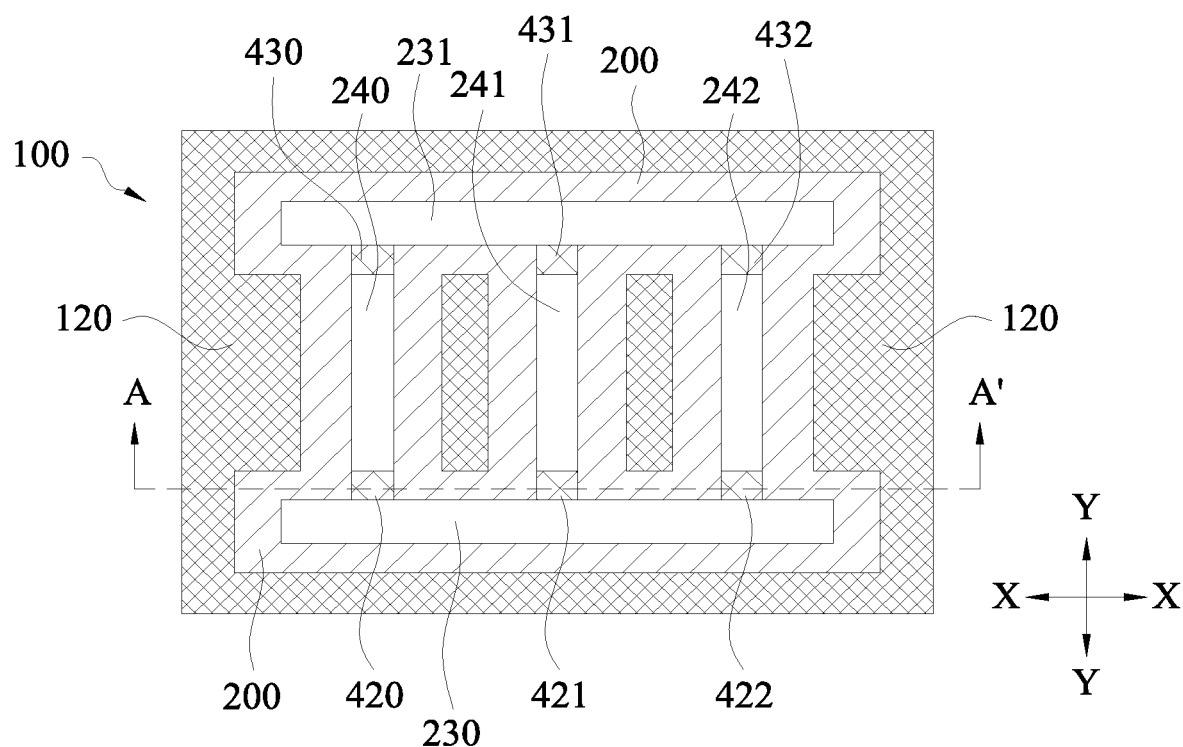
Figure 7B:
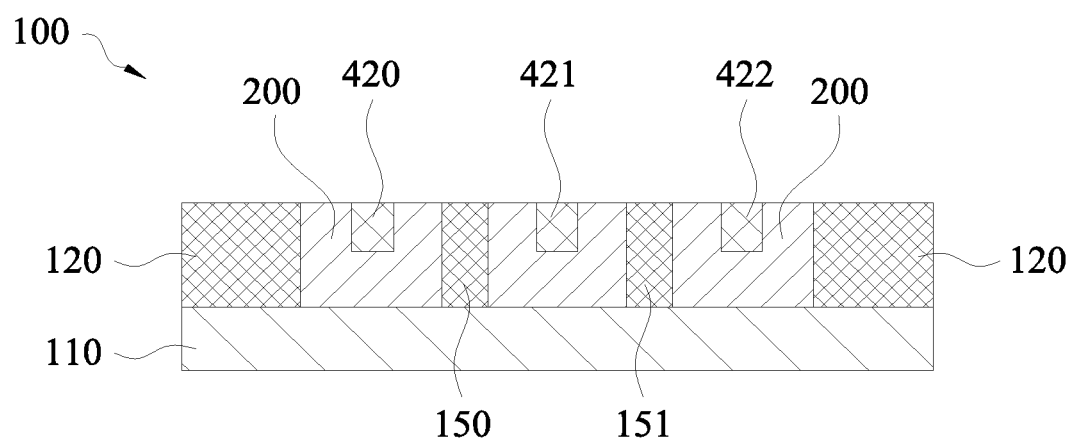

Referring now to FIGS. 7A-7B, an etching process is performed to etch the spacer layer 200. Portions of the spacer layer 200 are etched away until the hard mask layer 120 is exposed. In this manner, the hard mask layer 120 serves as an etching-stop layer. To ensure that the hard mask layer 120 can function effectively as an etching-stop layer, the material compositions of the hard mask layer 120 and the spacer layer 200 as well as the etchant of the etching process are selected so that there is sufficient etching selectivity between the hard mask layer 120 and the spacer layer 200. The etching process also removes some portions of the segments 420-422 and 430-432.

Figure 8A:
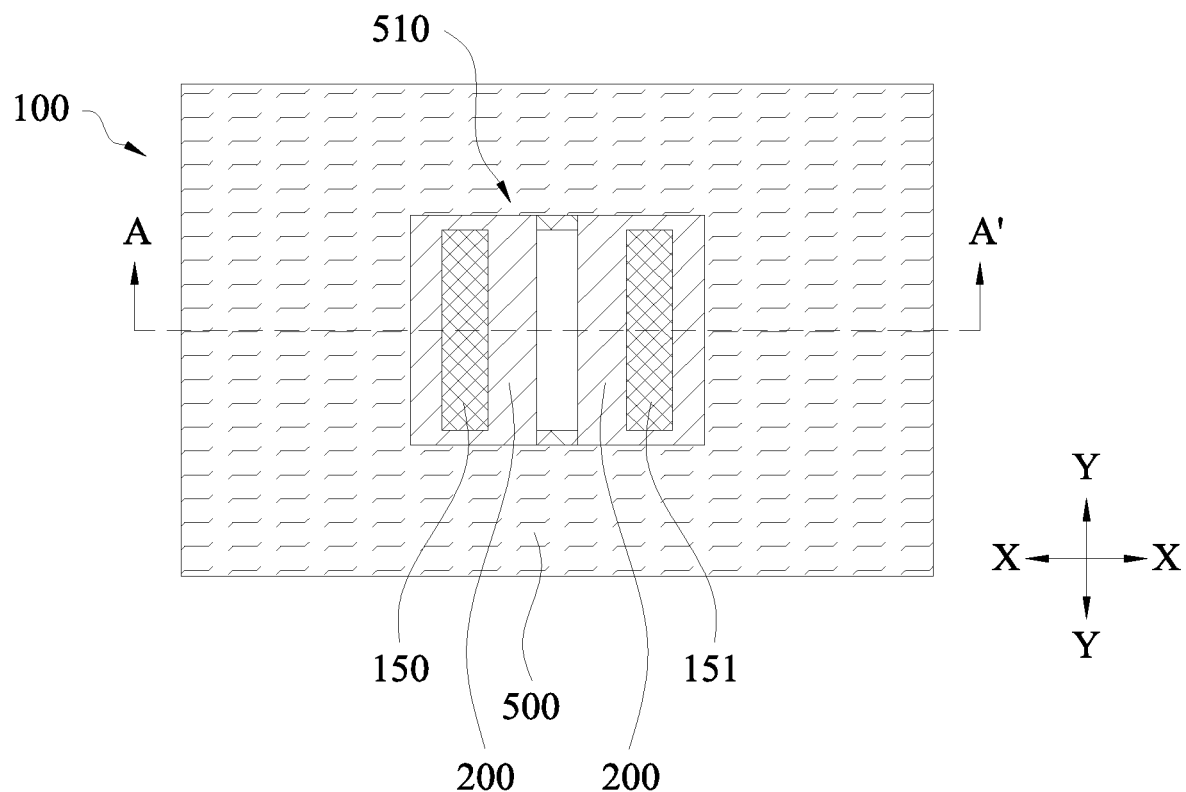
Figure 8B:
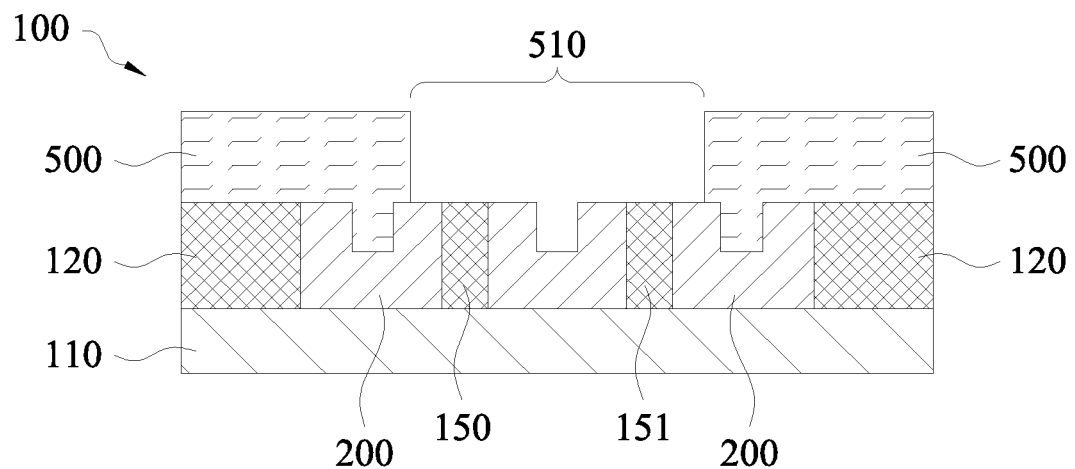

Referring now to FIGS. 8A-8B, a patterned photoresist layer 500 is formed over the semiconductor device 100. The patterned photoresist layer 500 includes an opening 510. The opening 510 is located over, and exposes, the "islands" 150-151, which as discussed above are portions of the hard mask layer 120. This is so that the islands 150-151 may be removed in a subsequent process.

Figure 9A:
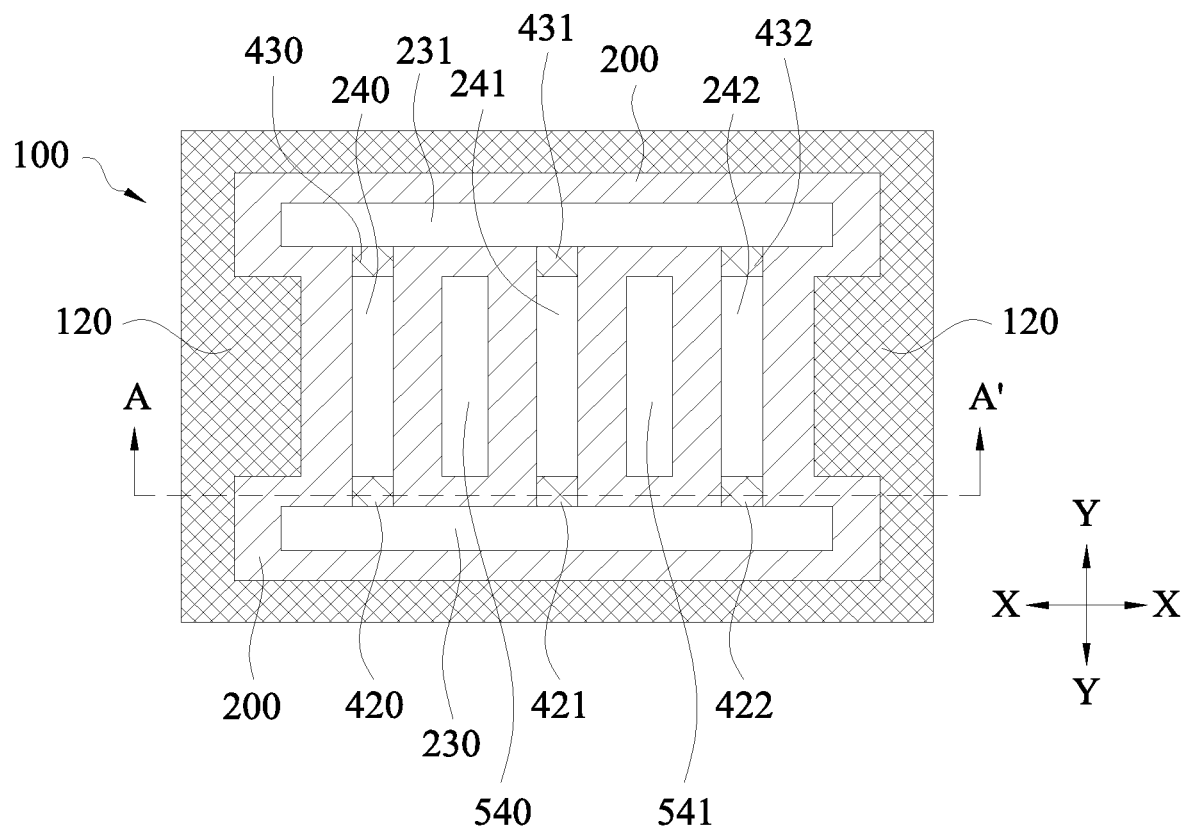
Figure 9B:
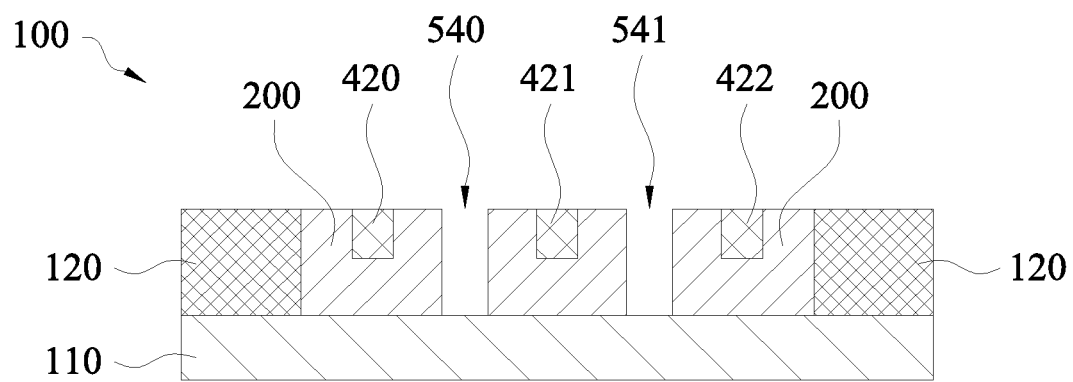

Referring now to FIGS. 9A-9B, an etching process is performed to the semiconductor device 100 to etch away the islands 150-151 exposed by the opening 510, while the rest of the semiconductor device 100 is protected under the patterned photoresist layer 500. After the islands 150-151 are removed, the patterned photoresist layer 500 is also removed in a process such as a photoresist ashing or stripping process. The removal of the islands 150-151 causes openings 540 and 541 to be formed in the spacer layer 200, respectively. The locations of the openings 540-541 correspond to the locations of the metal lines LB, which will be formed in subsequent fabrication processes. As is clearly illustrated in the planar view of FIG. 9A, the openings 540 and 541 are physically separated from the openings 230-231 by the segments 420-422 and 430-432. This ensures the physical separation of the rail structures and the metal lines LB (both will be formed subsequently, as discussed below).

Figure 10A:
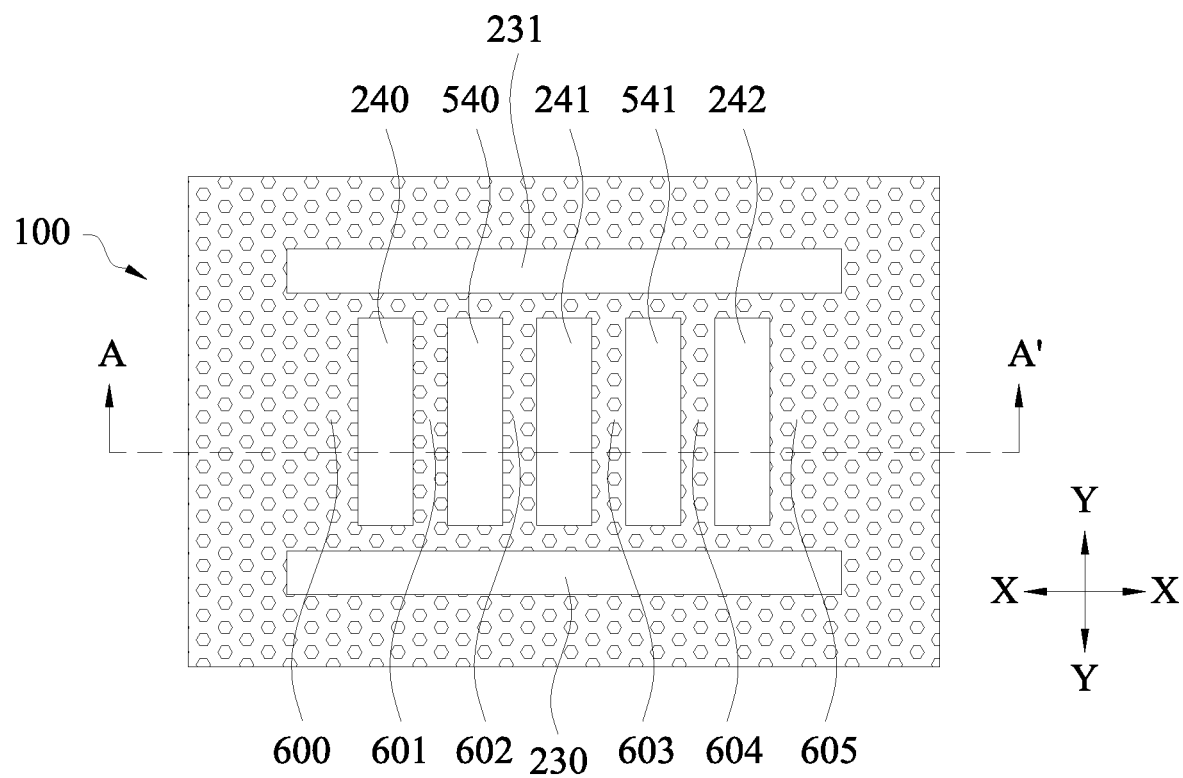
Figure 10B:
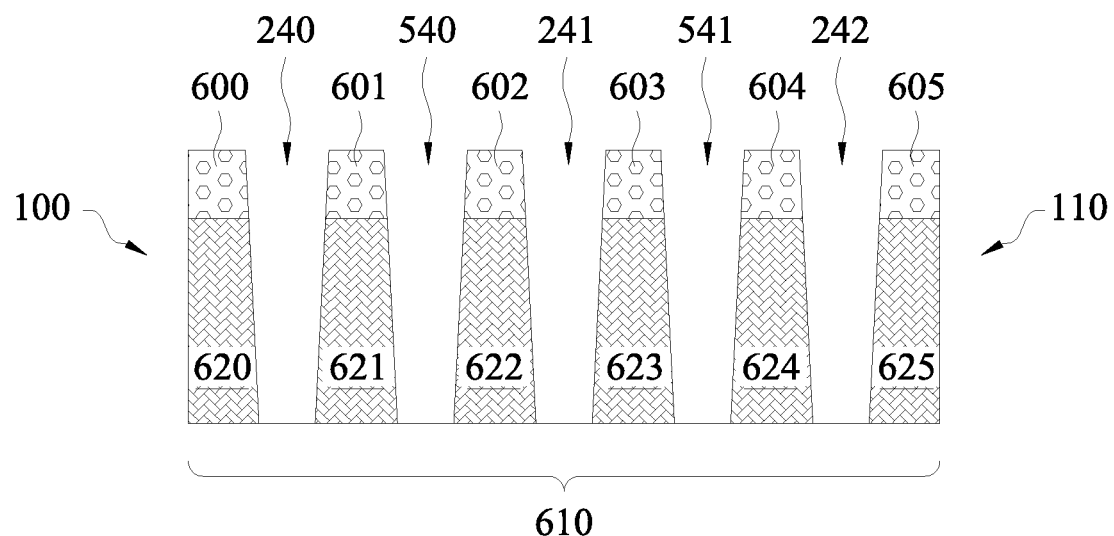

Referring now to FIGS. 10A-10B, the spacer layer 200 and the segments 420-422 and 430-432 are used as a mask to etch the hard mask layer 110. As a result, the hard mask layer 110 is etched into a plurality of hard mask segments 600, 601, 602, 603, 604, and 605, separated from one another by the openings 240-242 and 540-541. As discussed above, the semiconductor device 100 may include further layers and components below the hard mask layer 110 (now patterned into the segments 600-605). The hard mask segments 600-605 may be used to pattern the layers below. In some embodiments of the present disclosure, the semiconductor device 100 includes a metal interconnect layer, for example a Metal-1 (referred to as M1) metal layer that had already been formed below the hard mask segments 600-605.

The semiconductor device 100 may also include a low-k dielectric layer 610 (e.g., containing a low-k dielectric material such as $SiC_xO_yH_z$ where x, y, z each range from 0 to n) formed above the Metal-1 layer but below the hard mask segments 600-605. Thus, the hard mask segments 600-605 are used to pattern the low-k dielectric layer 610 into low-k dielectric segments 620, 621, 622, 623, 624, and 625. As a result, the openings 240-242 (defining the metal lines LA), 540-541 (defining the metal lines LB), and 230-231 (defining the rail structures) are further extended into the low-k dielectric layer 610. Again, the openings 240-242 and 540-541 are physically separated from the openings 230-231 due to the presence of the segments 420-422 and 430-432, since they (serving as masks) protect the layer 110 from being etched, and these unetched portions of the layer 110 now separate the openings 230-231 from the openings 240-242 and 540-541. The separation of the 230-231 from the openings 240-242 and 540-541 helps ensures the physical separation of the rail structures and the metal lines LA and LB (both will be formed subsequently, as discussed below).

Figure 11A:
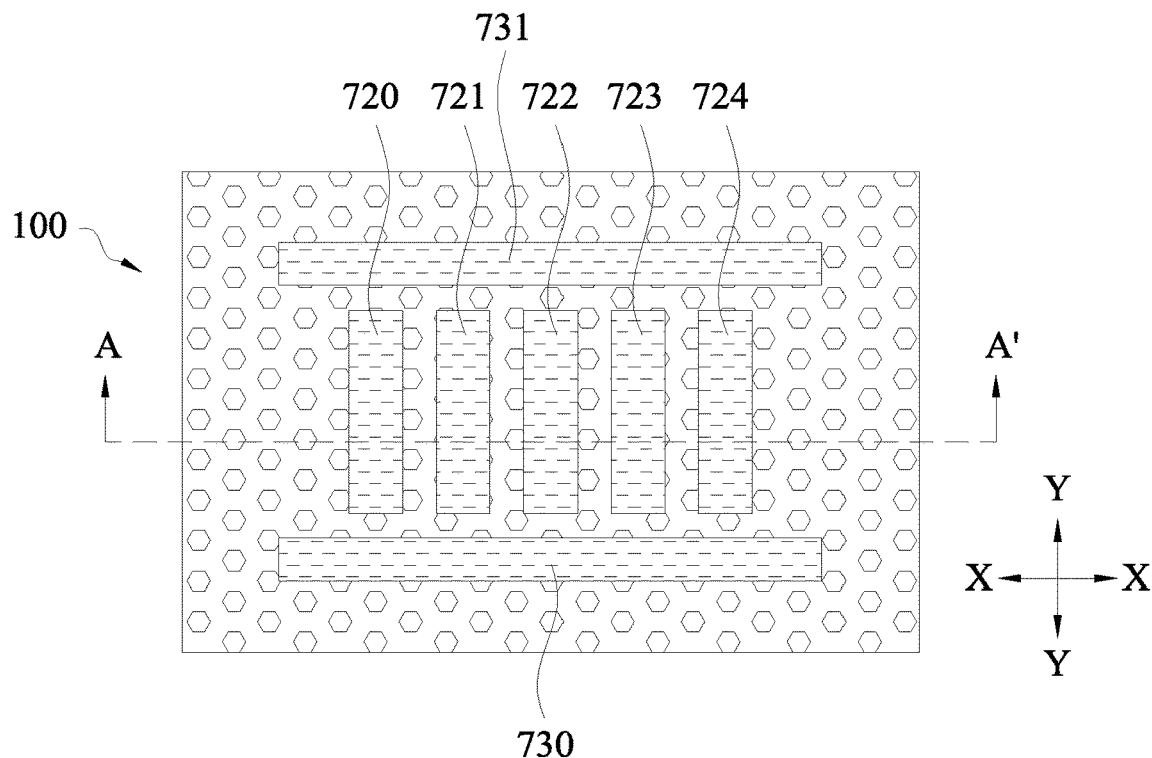
Figure 11B:
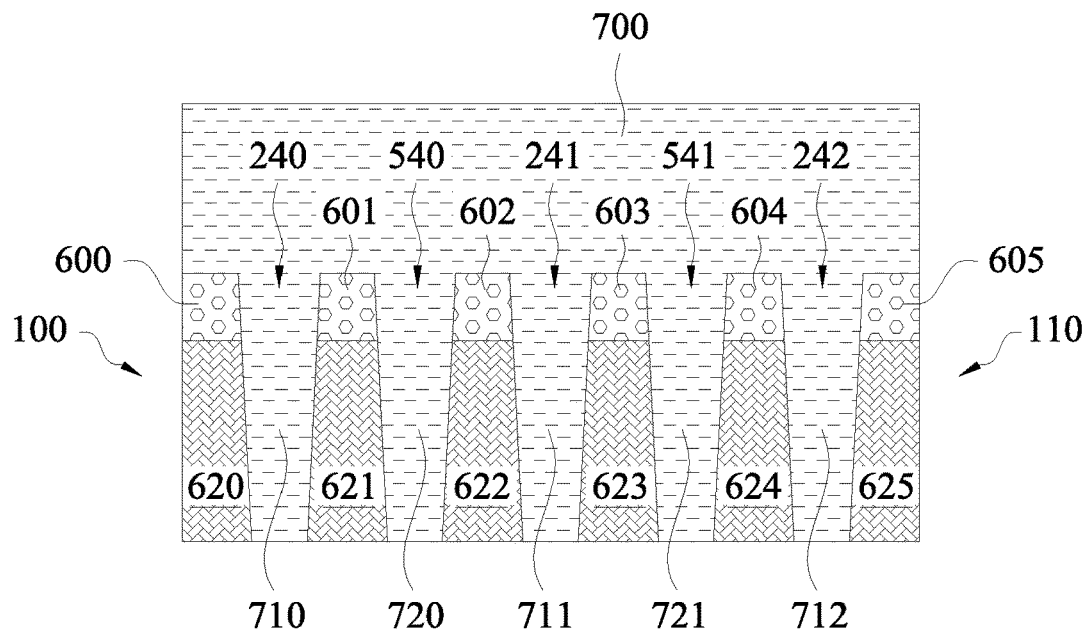

Referring now to FIGS. 11A-11B, a conductive material (e.g., a metal-containing material) 700 is formed over the semiconductor device 100. In some embodiments, the conductive material 700 contains Cu, Co, Ni, Ru, W, Al, or combinations thereof. The openings 230-231, 240-242, and 540-541 are filled by the conductive material 700. As such, portions of the conductive material 700 filling the openings 240, 241, and 242 form metal lines 710, 711, and 712, respectively, and portions of the conductive material 700 filling the openings 540 and 541 form metal lines 720 and 721, respectively. The metal lines 710-712 are the metal lines LA discussed above, and the metal lines 720-721 are the metal lines LB discussed above. Meanwhile, portions of the conductive material 700 filling the openings 230-231 form the rail structures 730-731, respectively. The rail structure 730 may be a voltage rail such as Vdd, and the rail structure 731 may be a ground rail, or vice versa.

Figure 12A:
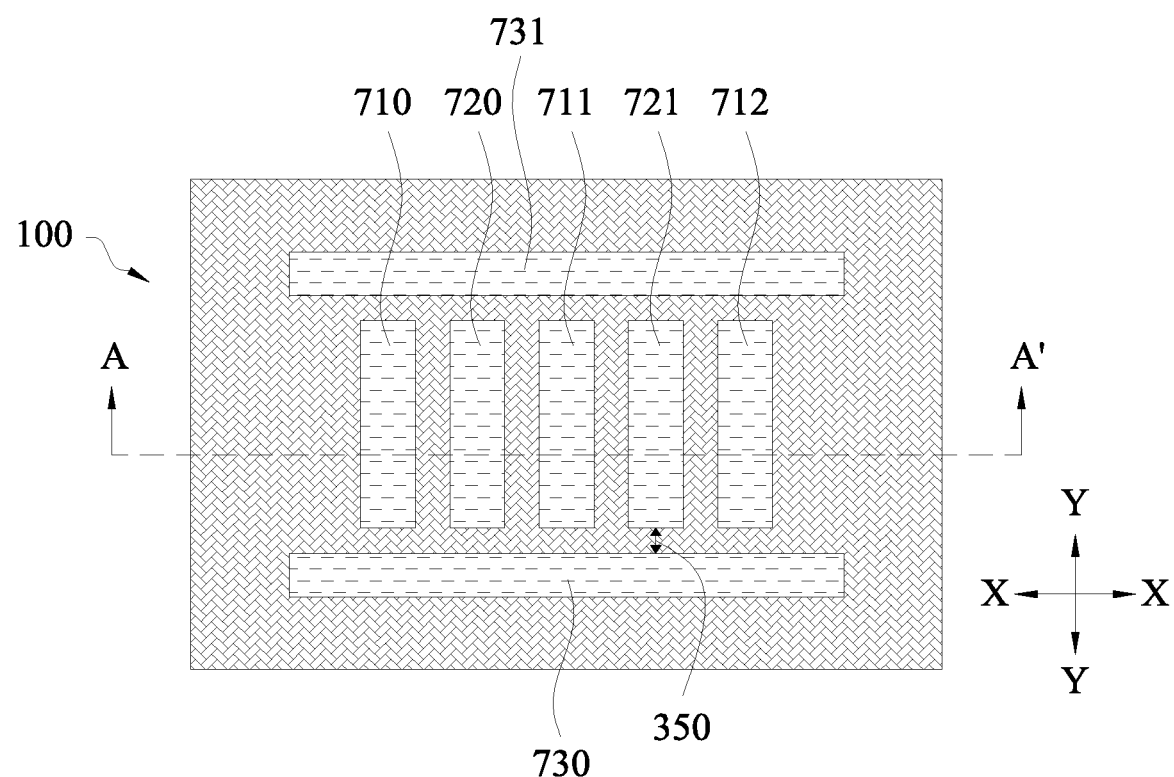
Figure 12B:
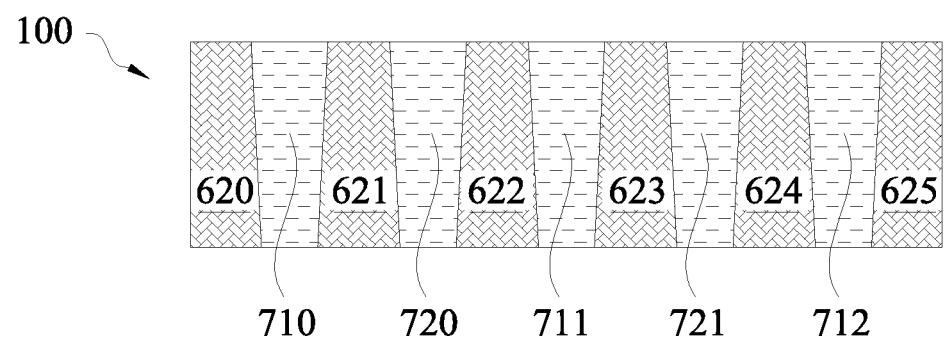

Referring now to FIGS. 12A-12B, a planarization process—for example a chemical mechanical polishing (CMP) process—may be performed to the semiconductor device 100 to remove the hard mask segments 600-605 and the excess portions of the conductive material 700 outside the openings 230-231, 240-242, 540-541. At this stage of fabrication, the Metal-2 metal layer of the semiconductor device 100 is formed. In this Metal-2 metal layer, the metal lines 710-712 and 720-721 are elongated and extend in the Y-direction in the planar view of FIG. 12A. In comparison, the rail structures 730-731 are also elongated, but they extend in the X-direction in the planar view of FIG. 12A.

The rail structures 730-731 are physically and electrically separated from the metal lines 710-712 and 720-721. As discussed above, this is due to the various fabrication processes discussed above, such as the fabrication processes performed to form the segments 420-422 and 430-432 (shown in FIGS. 9A-9B), etc. As discussed above with reference to FIG. 4A, the separation between the rail structure 730/731 and the metal lines 710-712 and 720-721 may be measured by the dimension 350 (e.g., a distance measured in the Y-direction in FIG. 12A). In some embodiments, the dimension 350 is configured to be less than about 40 nanometers.

Based on the discussions above, it can be seen that metal lines extending in a first direction can be formed in the same metal layer as rail structures that extend in a second direction, where the first direction is different from the second directions (e.g., orthogonal to each other). This is useful, as the rail structures can be electrically interconnected with rail structures located in a different metal layer, for example in a metal layer thereabove or therebelow.

Figure 13A:
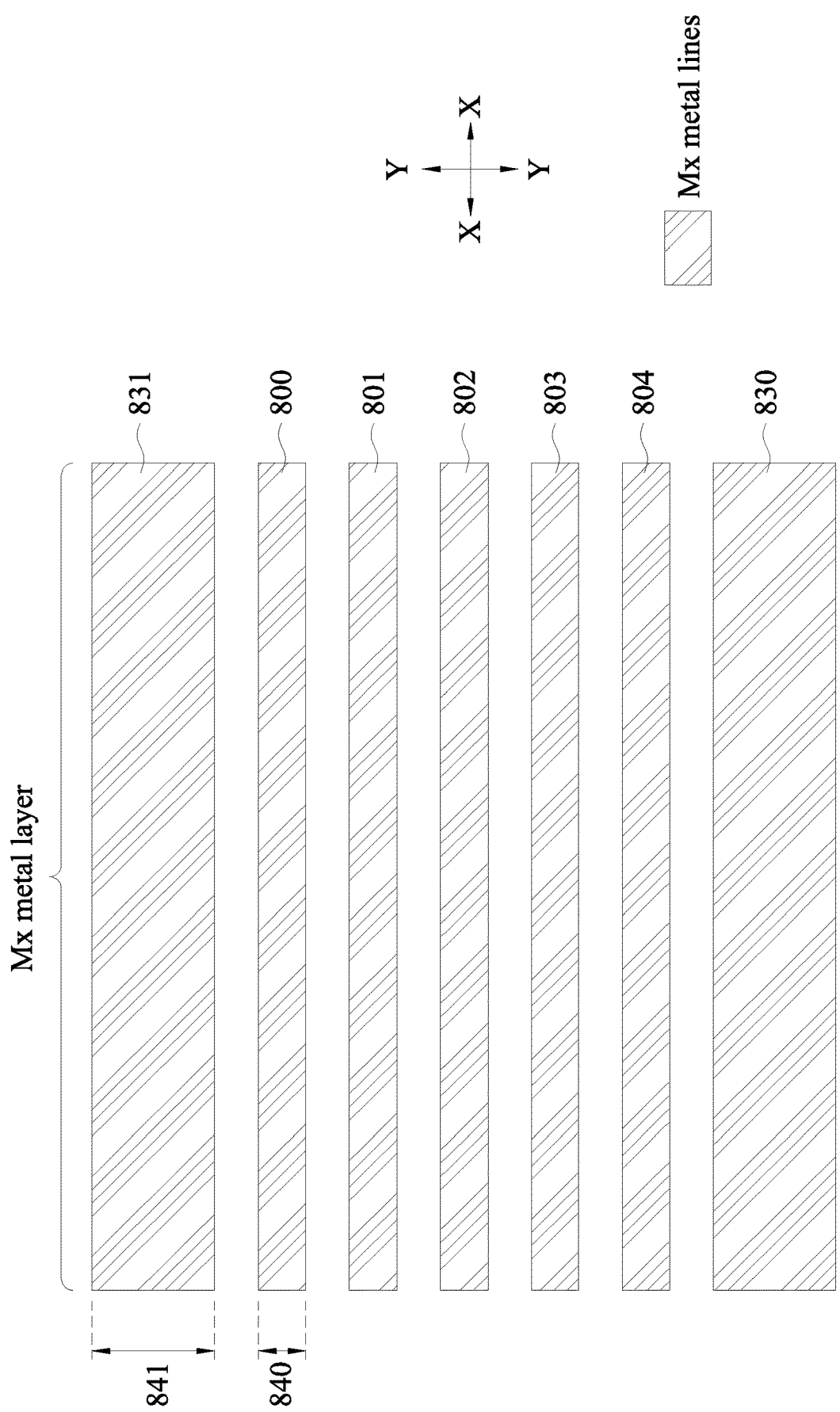
FIGS. 13A-13B are planar views of different metal layers according to embodiments of the present disclosure.
Figure 13B:
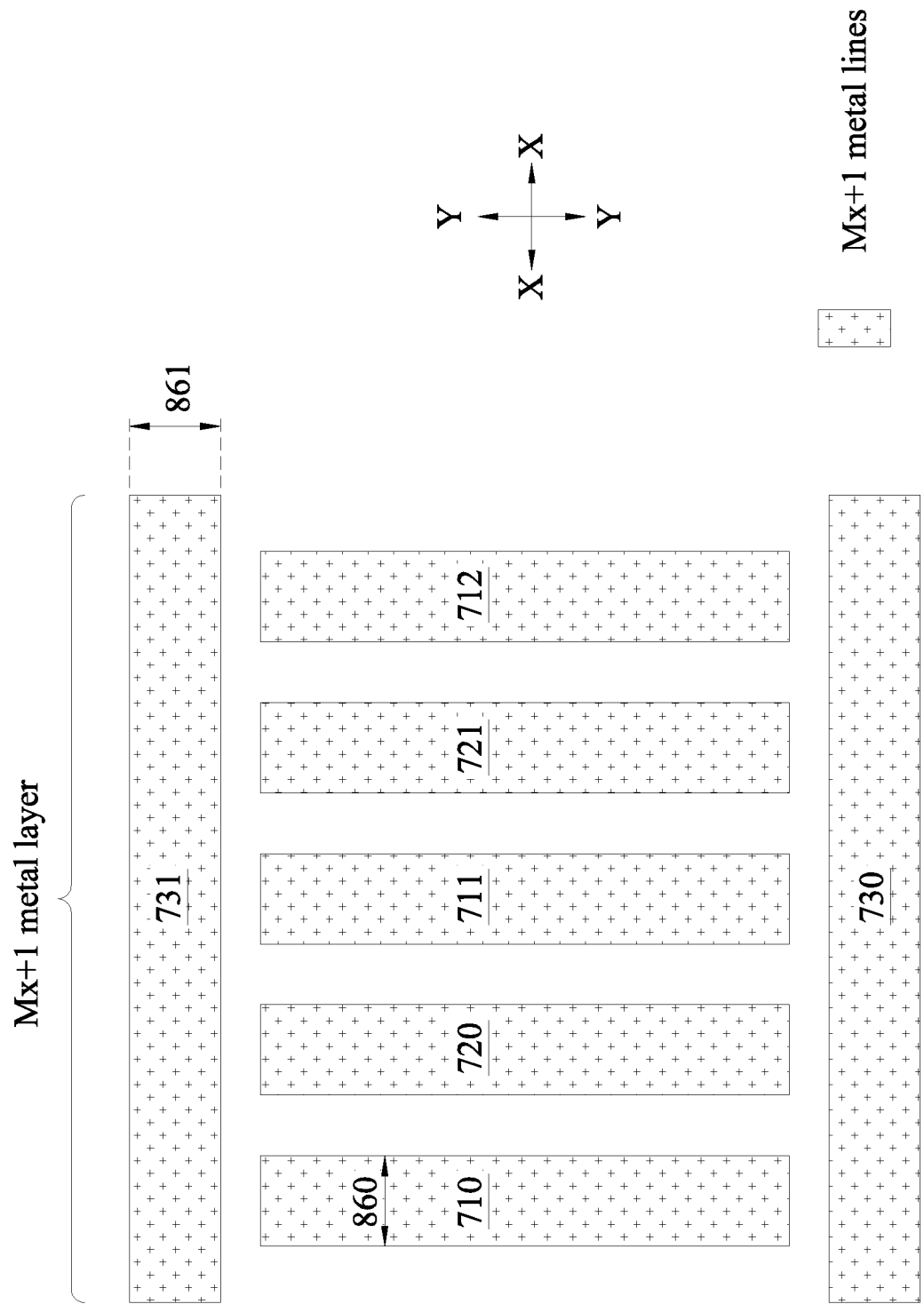

For example, referring now to FIGS. 13A and 13B, where FIG. 13A is a simplified fragmentary planar view of a $M_x$ metal layer (e.g., M1), and FIG. 13B is a simplified fragmentary planar view of a $M_{x+1}$ metal layer (e.g., M2) that is located directly above the $M_x$ metal layer in the sense that there are no other metal layers in between the $M_x$ metal layer and the $M_{x+1}$ metal layer, though there is a low-k dielectric material and vias between the $M_x$ and $M_{x+1}$ metal layers. The $M_x$ and $M_{x+1}$ metal layers illustrated in FIGS. 13A and 13B may be parts of the same circuit cell, for example a CMOS cell.

As shown in FIG. 13A, the $M_x$ metal layer includes a plurality of metal lines 800, 801, 802, 803, and 804 that each extend in the X-direction (or along the X-axis). The $M_x$ metal layer also includes rail structures 830 and 831 that also extend in the X-direction (or along the X-axis). The rail structures 830-831 may be power rails designed to handle a relatively large (relative to the metal lines 800-804) amount of electrical voltage or current. For example, the rail structure 830 may be a voltage rail, and the rail structure 831 may be a ground rail, or vice versa. In some embodiments, the rail structures 830-831 and the metal lines 800-804 are formed using the same fabrication processes and have the material compositions as the metal lines 800-804.

However, due to electromigration concerns discussed above, the rail structures 830 or 831 are typically formed to have larger dimensions than the metal lines 800-804. For example, the metal lines 800-804 may each have a dimension 840 measured in the Y-direction, while the rail structures 830-831 may each have a dimension 841 measured in the Y-direction. The dimension 841 is substantially larger (e.g., at least multiple times larger) than the dimension 840. In some embodiments, a ratio between the dimension 841 and the dimension 840 is in a range from about 1:1 to about 4:1. The dimension 840 may also be referred to as the critical dimension (CD) of the metal lines 800-804, and the dimension 841 may also be referred to as the critical dimension of the rail structures 830-831.

Referring now to FIG. 13B, the $M_{x+1}$ metal layer includes a plurality of metal lines that each extend in the Y-direction (or along the Y-axis), for example the metal lines 710-712 and 720-721 discussed above with reference to FIGS. 11A-11B and 12A-12B. The $M_{x+1}$ metal layer also includes rail structures 730 and 731 that extend in the X-direction (or along the X-axis). Similar to the rail structures 830-831, the rail structures 730-731 may be power rails designed to handle a relatively large amount of electrical voltage or current. In embodiments where the rail structure 730 is a voltage rail, and the rail structure 731 is a ground rail, the rail structure 830 is also a voltage rail, and the rail structure 831 is also a ground rail. In embodiments where the rail structure 730 is a ground rail, and the rail structure 731 is a voltage rail, the rail structure 830 is also a ground rail, and the rail structure 831 is also a voltage rail.

The metal lines 710-712 and 720-721 in the $M_{x+1}$ metal layer may each have a dimension 860 (e.g., the CD of these metal lines) measured in the X-direction, while the rail structures 730-731 may each have a dimension 861 (e.g., the CD of these rail structures) measured in the Y-direction. The dimension 861 may be larger than the dimension 860. In some embodiments, a ratio between the dimension 861 and the dimension 860 is in a range from about 1:1 to about 4:1. In some embodiments, the dimension 861 is also smaller than the dimension 841.

Figure 14:
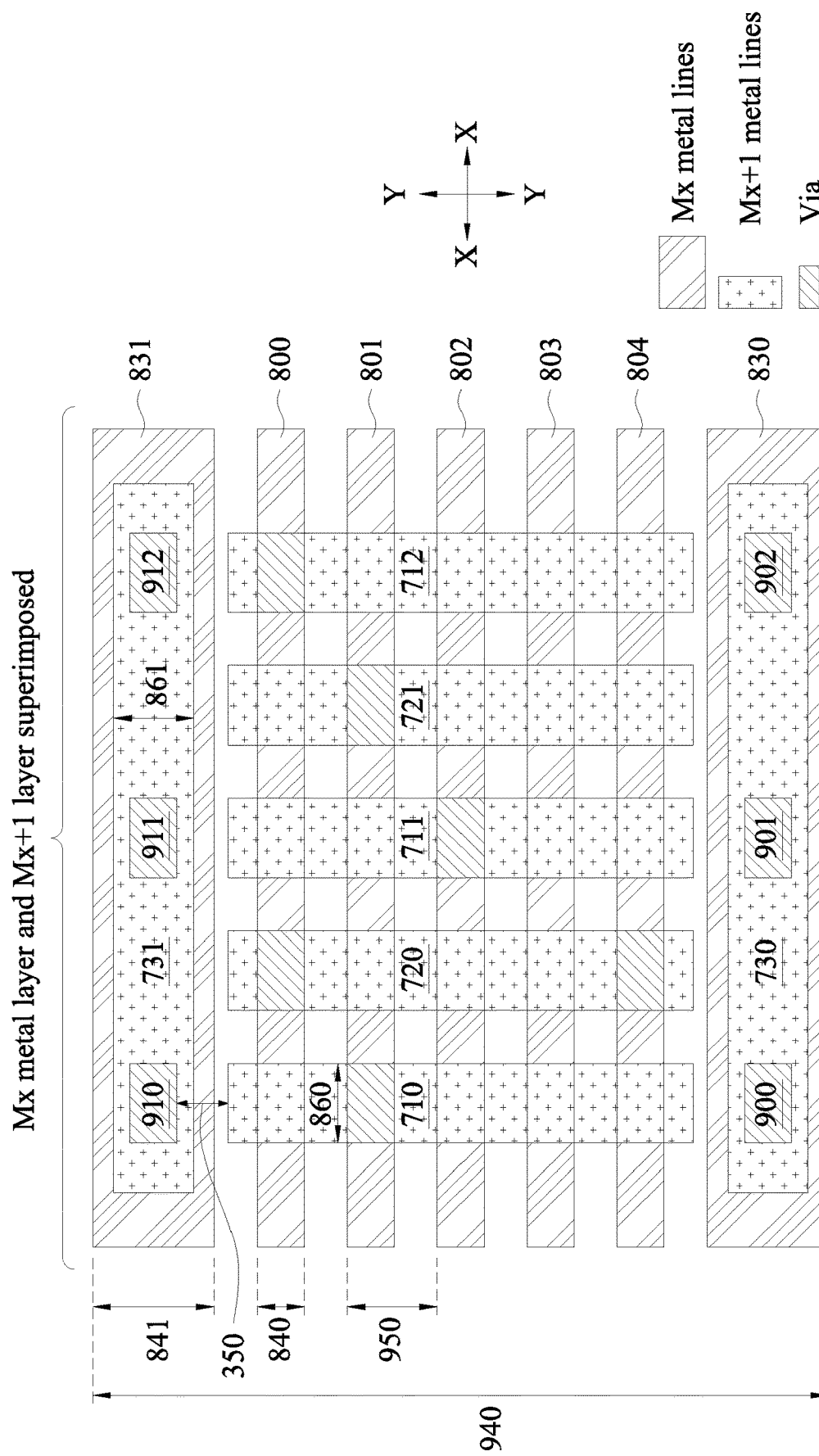
FIG. 14 is a planar view of two superimposed metal layers according to embodiments of the present disclosure.

Although it may not be immediately apparent in FIGS. 13A-13B, it is understood that the rail structure 730 is also overlapping with the rail structure 830, and the rail structure 731 is also overlapping with the rail structure 831 (this overlap will be shown more clearly in the planar view of FIG. 14), in a planar view. For example, the rail structure 830 is disposed above the rail structure 730, and the rail structure 831 is disposed above the rail structure 731. One set of vias (shown in FIG. 14 discussed below) located between the $M_x$ metal layer and the $M_{x+1}$ metal layer electrically interconnect the rail structures 830-730 together, and another set of vias located between the $M_x$ metal layer and the $M_{x+1}$ metal layer electrically interconnect the rail structures 831-731 together. In this manner, the rail structures 730-830 collectively serve as a rail structure, while the rail structures 731-831 collectively serve as another rail structure. In this manner, it may be said that a larger rail structure are "split up" into smaller rail structures located in two different but adjacent metal layers.

Splitting a large rail structure into smaller rail structures located in different metal layers in accordance with the aspects of the present disclosure is beneficial, since this reduces cell size (also referred to as cell height). Conventional circuit cell designs typically implement large rail structure to address electromigration concerns, but this would increase the size of the circuit cell. It is possible to split up the large rail structure into different (though not adjacent) metal layers, such as between a $M_x$ layer and a $M_{x+2}$ layer. This is done because in most IC designs, metal lines within any given metal layer are oriented in the same direction (e.g., either the X-direction or the Y-direction), and the metal lines in a metal layer are oriented orthogonally (or perpendicularly) with respect to the other metal lines in an adjacent metal layer. Thus, if overlapping rail structures (i.e., the rail structures being split up into different metal layers) are needed, they could not be implemented in adjacent metal layers. Unfortunately, this approach would lead to complexities in routing, as well as wasted routing resources.

In comparison, the present disclosure describes a method (discussed above with reference to FIGS. 1A-12A and 1B-12B) to fabricate metal lines and rail structures that are oriented orthogonally with respect to one another in the same metal layer. For example, in the $M_{x+1}$ metal layer, the metal lines 710-712 and 720-721 are oriented to extend in the Y-direction, while the rail structures 730-731 are oriented to extend in the X-direction. This allows the split up rail structures 730-830 (or 731-831) to be implemented in adjacent metal layers such as in the $M_x$ and $M_{x+1}$ metal layers, respectively. Since the rail structures 730-830 (or 731-831) are located in adjacent metal layers, routing is simple, as they may be electrically interconnected together using vias that are located directly above or below them. Consequently, the present disclosure reduces routing complexity while also achieving the benefits of splitting up the rail structures, namely reducing the circuit cell size.

FIG. 14 is a superimposed planar view of the $M_x$ and $M_{x+1}$ metal layers. As is shown in FIG. 14, the rail structure 730 is overlapping with the rail structure 830, and the rail structure 731 is overlapping with the rail structure 831. In some embodiments, the borders of the rail structures 730-731 are surrounded by the borders of the rail structures 830-831, respectively. In some embodiments, the dimension 841 of the rail structure 831 is in a range from about 25 nanometers to about 30 nanometers, for example about 28 nanometers, and the dimension 861 of the rail structure 731 is in a range from about 22 nanometers to about 26 nanometers, for example about 24 nanometers. In comparison, a single rail structure (that is not split up) may have a dimension of about 50 nanometers, which is much larger than the dimensions of the rail structures of the present disclosure.

As discussed above, the fabrication process flow of the present disclosure allows the rail structures 730-731 in the $M_{x+1}$ metal layer to be oriented orthogonally to the metal lines 710-712 or 720-721 in the same $M_{x+1}$ metal layer, while ensuring the physical separation between the rail structures 730-731 and the metal lines 710-712 or 720-721. This is done to avoid electrical shorting between the rail structure 730/731 and any of the metal lines 710-712 or 720-721, which would have been undesirable. Therefore, the present disclosure is implemented such that a distance 350 (corresponding to the dimension 350 discussed above with reference to FIG. 4A) exists between the rail structure 730/731 and any of the metal lines 710-712 or 720-721. In some embodiments, the distance 350 is less than about 40 nanometers, for example in a range between about 10 nanometers and 40 nanometers.

A plurality of conductive vias is located between the $M_x$ and $M_{x+1}$ metal layers and provide electrical interconnections between the metal lines in these metal layers. A subset of the vias 900-902 is located above the rail structure 830 but below the rail structure 730, and as such electrically interconnects the rail structures 730 and 830 together. Another subset of the vias 910-912 is located above the rail structure 831 but below the rail structure 731, and as such electrically interconnects the rail structures 731 and 831 together.

In some embodiments, the number of the vias, the locations of the vias, and the sizes of the vias are configured such that they can tolerate a relatively large amount of electrical current or voltage that is consistent with a power rail (such as Vdd). For example, in the illustrated embodiment, three vias are used to electrically interconnect two rail structures located in adjacent metal layers, the vias are located such that they are somewhat evenly spread across the rail structure (e.g., left, middle, right), and the vias are about the same size as the rest of the vias that interconnect the metal lines in different metal layers. However, in other embodiments, a different number of vias may be used, and the via sizes and locations may change as well, as long as they can effectively handle the electrical current or voltages associated with the power rails.

As discussed above, being able to split the rail structures from one metal layer into two adjacent metal layers reduces the size of any given rail structure, and consequently this reduces the cell size. In some embodiments, a dimension 940 (referred to as a cell height) of the cell measured in the Y-direction as illustrated in FIG. 14 is in a range from about 170 nanometers to about 175 nanometers. Experimental results have shown that this may be a reduction of cell height of 10% or more, which leads to an improvement in circuit device density (such as gate density).

The reduction in cell size (and increase in circuit device density) becomes even more important as the semiconductor device scaling down process continues. This is because as semiconductor device sizes get smaller and smaller, the size of the rail structures, if left unchanged, begins to dominate more and more of the cell area. The sizes of the cells and the devices may be correlated with a minimum pitch size of the metal lines. In the example embodiment illustrated in FIG. 14, the cell has a minimum pitch size 950, which is measured in the Y-direction and may be defined as the sum of the dimension 840 of one of the metal lines and the spacing between adjacent metal lines in the Y-direction (or alternative defined as the distance from one edge of a metal line to the same edge in an adjacent metal line). In some embodiments, the minimum pitch size 950 is less than about 50-60 nanometers (e.g., 54 nanometers). However, it is understood that the aspects of the present disclosure may still apply to other cells where the minimum pitch size is greater than about 50-60 nanometers as well.

The examples discussed above have illustrated forming orthogonal metal lines and rail structures in a $M_{x+1}$ metal layer, where the rail structures are overlapped with the rail structures in the $M_x$ metal layer located therebelow. However, it is understood that in alternative embodiments, the $M_{x+1}$ metal layer and the $M_x$ metal layer may be "flipped" as well, in the sense that the orthogonal metal lines and rail structures may be formed in a $M_x$ metal layer, where the rail structures in the $M_x$ metal layer are overlapped with the rail structures in a $M_{x+1}$ metal layer located thereabove. Furthermore, although the present disclosure illustrates splitting the rail structures in two adjacent metal layers, it is not limited to just two metal layers. In some embodiments, the rail structures may be split among three, four, or more metal layers while applying the concepts of the present disclosure discussed above.

Figure 15:
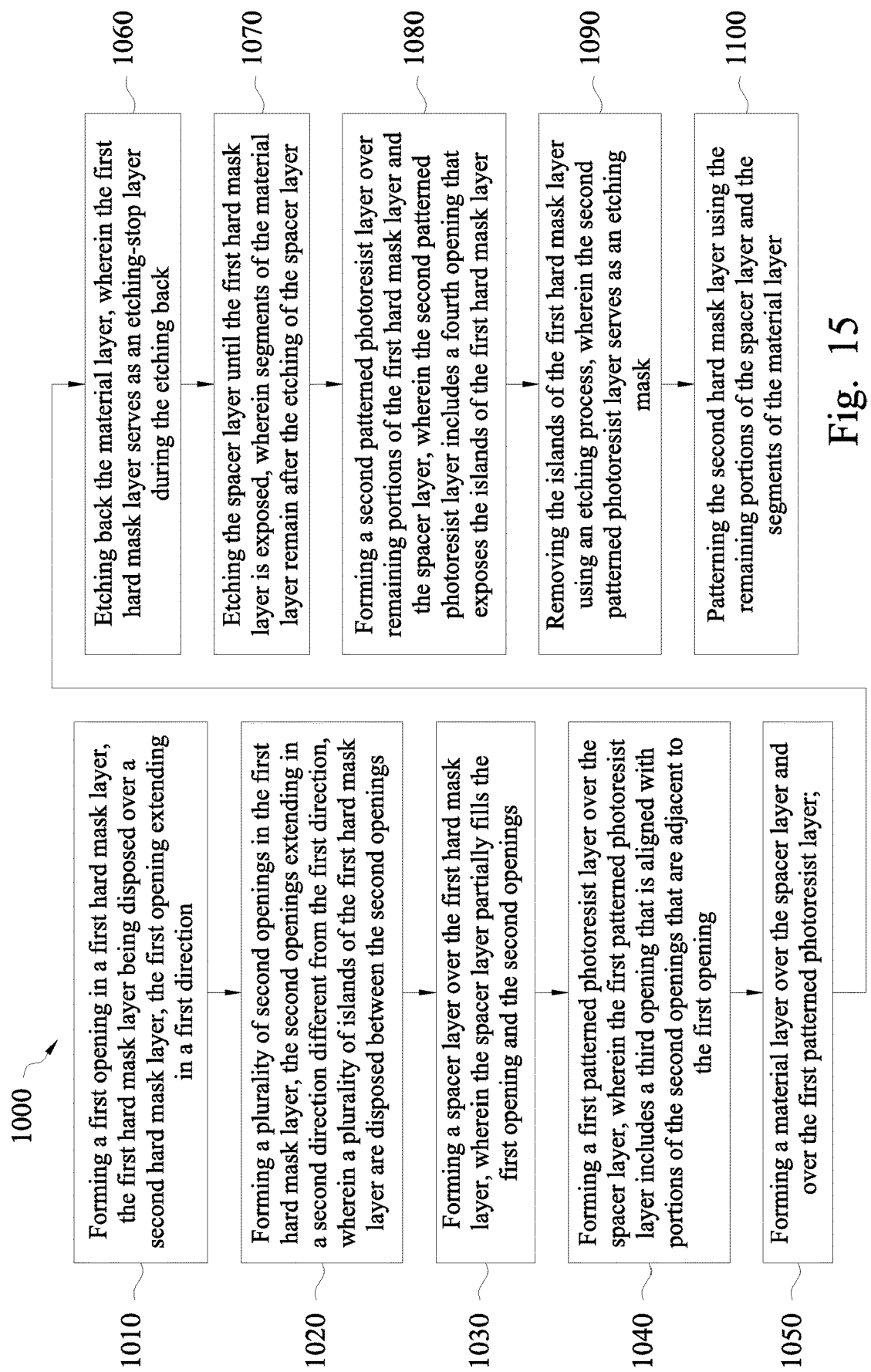
FIG. 15 is a flow chart of a method for fabricating a semiconductor device in accordance with embodiments of the present disclosure.

FIG. 15 is a flowchart of a method 1000 for fabricating a semiconductor device in accordance with various aspects of the present disclosure. The method 1000 includes a step 1010 of forming a first opening in a first hard mask layer. The first hard mask layer is disposed over a second hard mask layer. The first opening extends in a first direction.

The method 1000 includes a step 1020 of forming a plurality of second openings in the first hard mask layer. The second openings extends in a second direction different from the first direction. A plurality of islands of the first hard mask layer are disposed between the second openings.

The method 1000 includes a step 1030 of forming a spacer layer over the first hard mask layer. The spacer layer partially fills the first opening and the second openings.

The method 1000 includes a step 1040 of forming a first patterned photoresist layer over the spacer layer. The first patterned photoresist layer includes a third opening that is aligned with portions of the second openings that are adjacent to the first opening.

The method 1000 includes a step 1050 of forming a material layer over the spacer layer and over the first patterned photoresist layer.

The method 1000 includes a step 1060 of etching back the material layer. The first hard mask layer serves as an etching-stop layer during the etching back.

The method 1000 includes a step 1070 of etching the spacer layer until the first hard mask layer is exposed. Segments of the material layer remain after the etching of the spacer layer. In some embodiments, locations of the segments of the material layer are aligned with the third opening.

The method 1000 includes a step 1080 forming a second patterned photoresist layer over remaining portions of the first hard mask layer and the spacer layer. The second patterned photoresist layer includes a fourth opening that exposes the islands of the first hard mask layer.

The method 1000 includes a step 1090 of removing the islands of the first hard mask layer using an etching process. The second patterned photoresist layer serves as an etching mask.

The method 1000 includes a step 1100 of patterning the second hard mask layer using the remaining portions of the spacer layer and the segments of the material layer.

In some embodiments, the step 1100 of patterning the second hard mask layer is performed such that a rail opening and a plurality of metal line openings are formed in the second hard mask layer. The rail opening extends in the first direction, and the metal line openings each extend in the second direction. The rail opening is physically separated from the metal line openings.

It is understood that additional process steps may be performed before, during, or after the steps 1010-1100 discussed above to complete the fabrication of the semiconductor device. For example, the method 1000 may include a step of filling the rail opening and the metal line openings with a conductive material, thereby forming a rail structure and a plurality of metal lines, respectively. As another example, the method 1000 may include a step of using the rail structure as an electrical power supply or as an electrical ground. As yet another example, the method 1000 may include a step of: before the forming the first opening, forming a first metal layer below the second hard mask layer, wherein the first metal layer includes a rail structure extending in the first direction, and wherein the first opening is formed so that the first opening overlaps with the rail structure in a planar view. Other process steps are not discussed herein for reasons of simplicity.

Based on the above discussions, it can be seen that the present disclosure offers advantages over conventional systems and methods of forming rail structures. It is understood, however, that other embodiments may offer additional advantages, and not all advantages are necessarily disclosed herein, and that no particular advantage is required for all embodiments. One advantage is the reduction of cell (e.g., CMOS cell) size. This is due to the reduction of the size of the rail structures, since the rail structures can be split into two or more adjacent metal layers, where each metal layer now contains a smaller rail structure. The rail structures collectively can still handle the electromigration concerns adequately, since their combined sizes are not too different from the single (large) rail structure in conventional devices. Another advantage is that the present disclosure can accomplish the rail structure splitting without introducing additional routing complexity. Since the rail structures are formed in an overlapping manner (in a planar view) in adjacent metal layers, a set of vias would be sufficient to interconnect the rail structures. No other routing changes are needed. Furthermore, the fabrication processes of the present disclosure are also compatible with existing fabrication process flow and do not require special tools or processing equipment. Therefore, the present disclosure is cheap to implement.

One aspect of the present disclosure involves a semiconductor device. The semiconductor device includes a first interconnect layer. The first interconnect layer includes: a plurality of first conductive elements that each extend in a first direction; and a first rail that extends in the first direction. The semiconductor device includes a second interconnect layer different from the first interconnect layer. The second interconnect layer includes a plurality of second conductive elements that each extend in a second direction. The second direction is different from the first direction. The second interconnect layer also includes a second rail that extends in the first direction. The second rail is physically separated from the second conductive elements. The second rail overlaps with the first rail in a planar view and is electrically coupled to the first rail.

Another aspect of the present disclosure involves a semiconductor device. A first metal layer of the semiconductor device includes a plurality of first metal lines that each extend along a first axis, and a first rail structure that extends along the first axis. The first rail structure is physically separated from the first metal lines. A second metal layer is located over the first metal layer. The second metal layer includes a plurality of second metal lines that each extend along a second axis orthogonal to the first axis, and a second rail structure that extends along the first axis. The second rail structure is physically separated from the second metal lines. The second rail structure is located directly over the first rail structure. A plurality of vias is located between the first metal layer and the second metal layer. A subset of the vias electrically interconnects the first rail structure to the second rail structure.

Another aspect of the present disclosure involves a method of fabricating a semiconductor device. A first opening is formed in a first hard mask layer. The first hard mask layer is disposed over a second hard mask layer. The first opening extends in a first direction. A plurality of second openings is formed in the first hard mask layer. The second openings extend in a second direction different from the first direction. A plurality of islands of the first hard mask layer are disposed between the second openings. A spacer layer is formed over the first hard mask layer. The spacer layer partially fills the first opening and the second openings. A first patterned photoresist layer is formed over the spacer layer. The first patterned photoresist layer includes a third opening that is aligned with portions of the second openings that are adjacent to the first opening. A material layer is formed over the spacer layer and over the first patterned photoresist layer. An etching back process is performed to the material layer. The first hard mask layer serves as an etching-stop layer during the etching back. The spacer layer is etched until the first hard mask layer is exposed. Segments of the material layer remain after the etching of the spacer layer. A second patterned photoresist layer is formed over remaining portions of the first hard mask layer and the spacer layer. The second patterned photoresist layer includes a fourth opening that exposes the islands of the first hard mask layer. The islands of the first hard mask layer are removed using an etching process. The second patterned photoresist layer serves as an etching mask. The second hard mask layer is patterned using the remaining portions of the spacer layer and the segments of the material layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first rail that extends in a first direction;
a second rail that extends in the first direction;
a plurality of first metal lines disposed between the first rail and the second rail in a top view, wherein the first metal lines each extends in the first direction, wherein at least three or more of the first metal lines have substantially identical dimensions with one another;
a third rail that extends in the first direction;
a fourth rail that extends in the first direction;
a plurality of second metal lines disposed between the third rail and the fourth rail in the top view, wherein the second metal lines each extends in a second direction different from the first direction, wherein at least three or more of the second metal lines have substantially identical dimensions with one another;
a plurality of first vias that are disposed between the first rail and the third rail; and
a plurality of second vias that are disposed between the second rail and the fourth rail.

2. The semiconductor device of claim 1, wherein the second direction is perpendicular to the first direction.

3. The semiconductor device of claim 1, wherein:
the first rail and the second rail are each located in a first metal layer; and
the third rail and the fourth rail are each located in a second metal layer that is disposed over the first metal layer.

4. The semiconductor device of claim 3, wherein the first metal layer is a metal-0 layer, and the second metal layer is a metal-1 layer.

5. The semiconductor device of claim 1, wherein:
the first vias are uniformly spaced apart from one another in the top view; and
the second vias are uniformly spaced apart from one another in the top view.

6. The semiconductor device of claim 1, wherein the first vias and the second vias each have a greater dimension in the first direction than in the second direction.

7. The semiconductor device of claim 1, wherein a number of the first vias is equal to a number of the second vias.

8. The semiconductor device of claim 1, wherein one of the first vias overlaps with a middle segment of the first rail in the top view, another one of the first vias overlaps with a first end segment of the first rail in the top view, and a further one of the first vias overlaps with a second end segment of the first rail, the second end being opposite the first end in the top view.

9. The semiconductor device of claim 1, wherein:
borders of the first rail are surrounded by borders of the third rail in the top view; and
borders of the second rail are surrounded by borders of the fourth rail in the top view.

10. The semiconductor device of claim 1, wherein:
each of the first metal lines intersect with two or more of the second metal lines in the top view; and
each of the second metal lines intersect with two or more of the first metal lines in the top view.

11. The semiconductor device of claim 1, wherein:
the first rail or the second rail has a first dimension measured in the second direction;
the first metal lines each have a second dimension measured in the second direction; and
the first dimension is at least several times larger than the second dimension.

12. The semiconductor device of claim 1, wherein:
the third rail or the fourth rail has a third dimension measured in the second direction;
the second metal lines each have a fourth dimension measured in the first direction; and
the third dimension is larger than the fourth dimension.

13. The semiconductor device of claim 1, wherein the first rail and the third rail are each a voltage rail or a ground rail.

14. A semiconductor device, comprising:
a first rail structure and a second rail structure that each extends in a first direction in a top view, wherein the first rail structure or the second rail structure includes a power rail or a ground rail of an Integrated Circuit (IC);
a plurality of first metal lines disposed between the first rail structure and the second rail structure in the top view, wherein the first metal lines each extends in the first direction in the top view, and wherein three or more of the first metal lines have substantially identical dimensions with one another;
a third rail structure and a fourth rail structure that each extends in the first direction in the top view, wherein the third rail structure is located over the first rail structure in a side view, and wherein the fourth rail structure is located over the second rail structure in the side view;
a plurality of second metal lines disposed between the third rail structure and the fourth rail structure in the top view, wherein the second metal lines each extends in a second direction different from the first direction in the top view, and wherein each of the second metal lines partially overlaps with at least one of the first metal lines in the top view, and wherein three or more of the second metal lines have substantially identical dimensions with one another;
a plurality of first vias that electrically connect the first rail structure to the third rail structure, wherein the first vias are spread out in the top view with respect to the first rail structure or with respect to the third rail structure; and
a plurality of second vias that electrically connect the second rail structure to the fourth rail structure, wherein the second vias are spread out in the top view with respect to the second rail structure or with respect to the fourth rail structure.

15. The semiconductor device of claim 14, wherein:
the second direction is perpendicular to the first direction;
the first rail structure and the second rail structure are each located in a first interconnect layer; and
the third rail structure and the fourth rail structure are each located in a second interconnect layer that is one level above the first interconnect layer.

16. The semiconductor device of claim 14, wherein:
a number of the first vias or a number of the second vias is at least three; and
the first vias and the second vias each have a greater dimension in the first direction than in the second direction.

17. The semiconductor device of claim 14, wherein:
the first rail structure is surrounded by the third rail structure in the top view; and
the second rail structure is surrounded by the fourth rail structure in the top view.

18. The semiconductor device of claim 14, wherein:
the first rail structure or the second rail structure has a first dimension measured in the second direction;
the first metal lines each have a second dimension measured in the second direction, the first dimension being at least several times larger than the second dimension;
the third rail structure or the fourth rail structure has a third dimension measured in the second direction; and
the second metal lines each have a fourth dimension measured in the first direction, the third dimension being larger than the fourth dimension.

19. A semiconductor device, comprising:
a first metal layer of a multi-layer interconnect structure, wherein the first metal layer includes:
  a first rail that extends in a first direction in a top view;
  a second rail that extends in the first direction in the top view; and
  a plurality of first metal lines disposed between the first rail and the second rail in the top view, wherein the first metal lines each extends in the first direction in the top view, and wherein at least three or more of the first metal lines have substantially identical dimensions with each other;
a second metal layer of the multi-layer interconnect structure, wherein the second metal layer is located one level above the first metal layer and includes:
  a third rail that extends in the first direction in the top view;
  a fourth rail that extends in the first direction in the top view;
  a plurality of second metal lines disposed between the third rail and the fourth rail in the top view, wherein the second metal lines each extends in a second direction in the top view, the second direction being perpendicular to the first direction, and wherein at least three or more of the second metal lines have substantially identical dimensions with each other;
at least three first vias that are disposed directly above the first rail and directly below the third rail in a side view; and
at least three second vias that are disposed directly above the second rail and directly below the fourth rail in the side view.

20. The semiconductor device of claim 19, wherein:
the first vias are uniformly spaced apart from one another in the top view; and
the second vias are uniformly spaced apart from one another in the top view.

* * * * *